US006497796B1

(12) United States Patent
Ashtiani et al.

(10) Patent No.: US 6,497,796 B1
(45) Date of Patent: *Dec. 24, 2002

(54) APPARATUS AND METHOD FOR CONTROLLING PLASMA UNIFORMITY ACROSS A SUBSTRATE

(75) Inventors: Kaihan A. Ashtiani, Mountain View, CA (US); Karl B. Levy, Los Altos, CA (US); Kwok F. Lai, Palo Alto, CA (US); Andrew L. Nordquist, Mountain View, CA (US); Larry D. Hartsough, Berkeley, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/653,611

(22) Filed: Aug. 31, 2000

Related U.S. Application Data

(63) Continuation-in-part of application No. 09/345,466, filed on Jun. 30, 1999, now Pat. No. 6,179,973.
(60) Provisional application No. 60/114,812, filed on Jan. 5, 1999.

(51) Int. Cl.$^7$ .............................................. C23C 14/35
(52) U.S. Cl. ............................ 204/192.12; 204/298.16; 204/298.17; 204/298.18; 204/298.19; 204/298.2; 204/298.21; 204/298.22
(58) Field of Search ....................... 204/298.12, 298.16, 204/298.17, 298.18, 298.19, 298.2, 298.21, 298.22, 192.12

(56) References Cited

U.S. PATENT DOCUMENTS

| | | | | |
|---|---|---|---|---|
| 3,669,860 A | * | 6/1972 | Knowles et al. | 204/298.16 |
| 4,622,121 A | | 11/1986 | Wegmann et al. | 204/298.21 |
| 4,721,553 A | | 1/1988 | Saito et al. | 204/298.22 |
| 4,853,102 A | * | 8/1989 | Tateishi et al. | 204/298.16 |
| 5,006,219 A | * | 4/1991 | Latz et al. | 204/298.16 |
| 5,022,977 A | | 6/1991 | Matsuoka et al. | 204/298.16 |
| 5,334,302 A | | 8/1994 | Kubo et al. | 204/298.18 |
| 5,482,611 A | | 1/1996 | Helmer et al. | 204/298.17 |
| 5,688,382 A | | 11/1997 | Besen et al. | 204/298.16 |
| 5,902,461 A | | 5/1999 | Xu et al. | 204/192.12 |
| 6,143,140 A | * | 11/2000 | Wang et al. | 204/192.12 |
| 6,179,973 B1 | * | 1/2001 | Lai et al. | 204/192.12 |
| 6,193,854 B1 | * | 2/2001 | Lai et al. | 204/192.12 |
| 6,217,716 B1 | * | 4/2001 | Lai | 204/192.12 |

FOREIGN PATENT DOCUMENTS

| | | | |
|---|---|---|---|
| JP | 61-190070 | 8/1986 | |
| JP | 1-116071 | 5/1989 | |
| JP | 1-309964 | * 12/1989 | 204/298.12 |
| JP | 6-285067 | 12/1991 | |

OTHER PUBLICATIONS

The Random House College Dictionary, 1975, pp. 1431.*
Gruzdev, V.A., et al., "Initiation of a dicharge with a cold hollow cathode by a gas magnetron", Sov. Phys. Tech, Oct., 1980, pp. 1228–1230.
K.F. Lai et al., "Ultra Low Resistivity Ti/TiN Diffusion Barriers Deposited by Hollow Cathode Magnetron Sputtering",.
K.F. Lai, et al., "Charaterization and integration of Hollow Cathode Magnetron Sputtered Ti/TiN With Low Pressure Al Palanarization",.

* cited by examiner

*Primary Examiner*—Rodney G. McDonald
(74) *Attorney, Agent, or Firm*—Skjerven Morrill LLP

(57) ABSTRACT

A magnetron source comprises a hollow cathode with a non-planar target. By using a magnet between the cathode and a substrate, plasma can be controlled to achieve high ionization levels, good step coverage, and good process uniformity. Step coverage uniformity is also improved by controlling the magnetic fields, and thus the flow of ions and electrons, near the plane of the substrate.

15 Claims, 24 Drawing Sheets

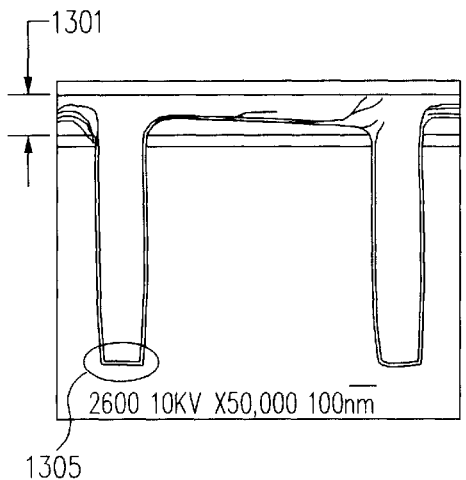
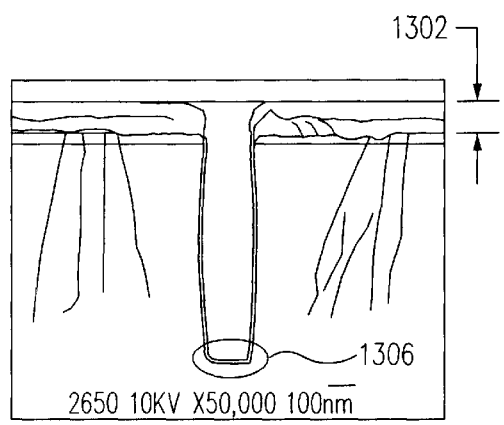
FIG. 11A          FIG. 11B
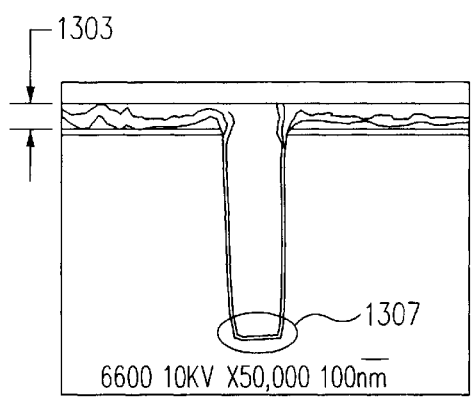
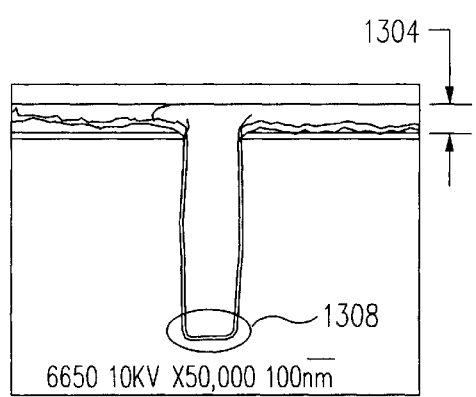
FIG. 11C          FIG. 11D

APPARATUS AND METHOD FOR CONTROLLING PLASMA UNIFORMITY ACROSS A SUBSTRATE

CROSS REFERENCE TO RELATED APPLICATIONS

This application is a continuation-in-part of U.S. patent application Ser. No. 09/345,466 filed on Jun. 30, 1999, now U.S. Pat. No. 6,179,973 which claims priority from U.S. Provisional Application No. 60/114,812 filed on Jan. 5, 1999.

BACKGROUND OF THE INVENTION

1. Field of the Invention

The present invention generally relates to sputtering apparatus and methods used in semiconductor device fabrication.

2. Description of the Related Art

In a physical vapor deposition ("PVD") process, atoms sputtered from a target are deposited onto a semiconductor substrate. The target, which could be made of aluminum, for example, is located a distance away from the substrate. A plasma of a gas suitable for sputtering, such as argon, is maintained between the target and the substrate. Ions of the sputtering gas are accelerated onto the target by applying a negative potential thereon. When accelerated ions hit the target, atoms are sputtered from the target and onto the substrate.

In a conventional PVD process, magnetic fields are employed to cause the electrons to spiral through the plasma and near the target, thereby increasing the electrons' residence time and ionization efficiency. This leads to higher ionization levels which, in turn, increases the deposition rate because there are more ions available to sputter atoms off the target and onto the substrate. The use of magnetic fields in a PVD process is also known as magnetron sputtering. In conventional magnetron sputtering, the ionization levels are not high enough throughout the chamber to yield substantially more ionized sputtered metal atoms than neutral metal atoms. Because neutral atoms are not affected by electric or magnetic fields, their trajectory towards the substrate cannot be influenced by using magnets or electric potential.

The control of the direction or flow of sputtered atoms onto the substrate is very important in any PVD process. For example, in applications requiring the deposition of a thin layer of barrier or liner metal in a trench or via, deposition of sufficient material on the bottom and sidewalls (step coverage) depends on the capability of the PVD process to direct the flow of sputtered atoms onto the substrate. In gap-fill applications, or filling of vias and trenches with primary metals, obtaining good step coverage similarly requires directionality of sputtered atoms. Conventional magnetron sputtering has proven to be inadequate in the aforementioned applications because it does not yield high levels of ionized atoms whose trajectories can be influenced by using magnetic or electric fields. This problem is exacerbated in the manufacture of advanced semiconductor devices where narrow and high-aspect ratio structures are used.

It is also important to obtain good step coverage uniformity across the substrate. Step coverage uniformity depends on precise control of the flow of sputtered atoms and ions to the substrate.

From the foregoing, it is highly desirable to be able to control the direction of sputtered atoms in a PVD process in order to achieve excellent step coverage with good deposition uniformity across the substrate.

SUMMARY OF THE INVENTION

The present invention provides for a novel hollow cathode magnetron source ("HCM"). By utilizing a magnet located between the cathode and a semiconductor substrate, the magnetic fields generated by the HCM can be shaped to increase the amount of plasma confined within the cathode, thereby increasing the ionization levels of sputtered atoms. Further, by controlling the field strength of the magnet between the cathode and the substrate, the direction or flow of the plasma escaping from the cathode can be adjusted to achieve a desired deposition uniformity.

Step coverage uniformity can also be improved by controlling the magnetic fields, and thus the flow of ions and electrons, near the plane of the substrate. In one embodiment, the magnetic fields near the plane of the substrate is controlled by using a substrate-level magnetic circuit that generates, for example, rotating, static, stepwise, or time-averaged magnetic fields. The substrate-level magnetic circuit can be employed in a variety of reactors including etch reactors, chemical vapor deposition reactors, and PVD reactors utilizing a target of any shape.

BRIEF DESCRIPTION OF THE DRAWINGS

FIGS. 11A and 11B show scanning electron micrographs of device features at the center and edge, respectively, of a substrate after a physical vapor deposition process using the HCM shown in FIG. 10A.

FIGS. 11C and 11D show scanning electron micrographs of device features at the center and edge, respectively, of a substrate after a physical vapor deposition process using the HCM shown in FIG. 10B.

The use of the same reference symbol in different figures indicates similar or identical elements.

DESCRIPTION OF THE PREFERRED EMBODIMENT(S)

The present invention provides for a novel hollow cathode magnetron source ("HCM"). The film step coverage and uniformity are enhanced by using a novel magnetic configuration to increase ionization levels and to directionally control the flow of plasma out of the cathode. In one embodiment of the invention, the HCM is shielded to reduce magnetic leakage.

U.S. Pat. No. 5,482,611 to Helmer et. al. ("Helmer"), incorporated herein by reference in its entirety, also discloses an HCM. Helmer teaches that by providing a magnetic field having a magnetic null region at the opening of the hollow cathode, ions and electrons can be trapped and retained inside the hollow cathode except for those which have entered into the upper edge of the null region with sufficient axial velocity and very little radial velocity. Ions and electrons that have primarily axial velocity are able to leave the hollow cathode along the axis at the upper edge of the null region. Most other plasma particles, however, are reflected back and confined in the hollow cathode thereby increasing the plasma density. In essence, the shape of the magnetic field providing the magnetic null functions like a mirror ("mirror effect") which reflects most of the electrons back into the hollow cathode in order to sustain a high density plasma. To maintain charge balance, positive ions will be confined in the cathode along with the electrons by ambipolar diffusion. An HCM which provides a null-field region, such as the one described in Helmer, for example, is also referred to as a null-field magnetron source.

Figure 1:
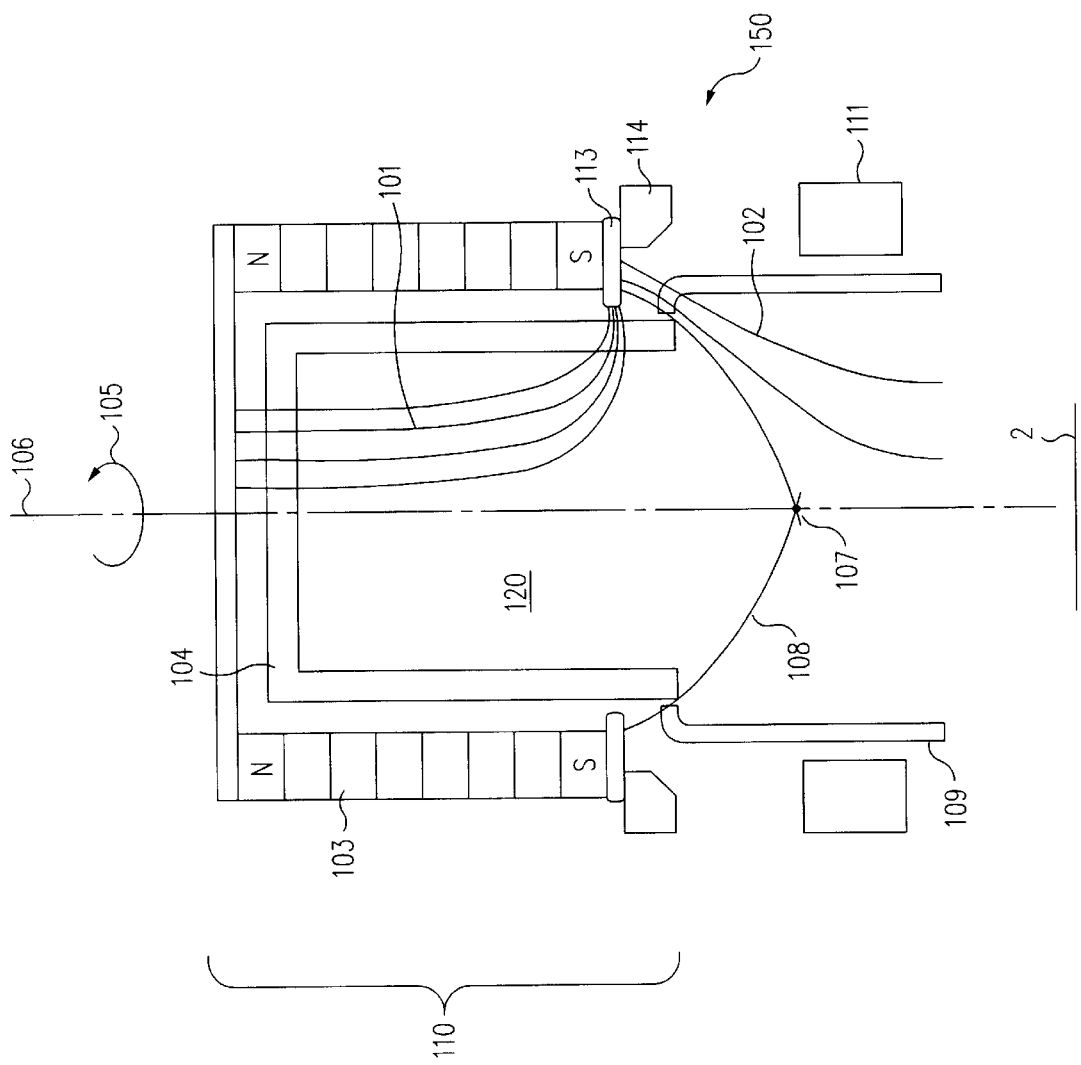
FIG. 1 shows a hollow cathode magnetron source according to the present invention.

FIG. 1 shows an HCM 150 according to the present invention. As indicated by an arrow 105, HCM 150 is symmetrical about an axis 106. HCM 150 has a cathode 110 and an electrically floating anode 109. Cathode 110 also includes a non-planar target 104 which provides the material to be deposited onto a wafer substrate 2. By way of example, target 104 can be made of aluminum, tantalum, titanium, or copper. Cathode 110 and target 104 can be of any hollow non-planar shape.

Plasma is generated in HCM 150 by introducing a sputtering gas, such as argon, through an inlet (not shown) and into a container portion 120 of cathode 110. By applying a negative bias in the order of −200 VDC to −600 VDC on cathode 110 while holding the chamber at ground potential (not shown), an electric field is generated across the sputtering gas. The negative bias on cathode 110 accelerates positive ions towards target 104 to sputter atoms from target 104 and onto substrate 2.

Main magnetic stack 103 generates the main magnetic fields of HCM 150. Magnetic stack 103 comprises a plurality of magnets which are stacked one on top of another. Magnetic stack 103 surrounds HCM 150 about symmetry axis 106. Some field lines of magnetic stack 103, shown as field lines 101, will loop onto target 104. Other magnetic field lines will be directed away from target 104 as shown by field lines 102. As taught by Helmer, field lines 101 confine the majority of ions and electrons within container 120 to maintain a high density plasma. Magnetic field line 108, also known as separatrix, is the boundary between field lines 101 and field lines 102 (hereinafter, the terms "separatrix" and "field line 108" will be used interchangeably). The separatrix serves as the boundary between plasma confined within container 120 and plasma that has escaped.

Figure 2:
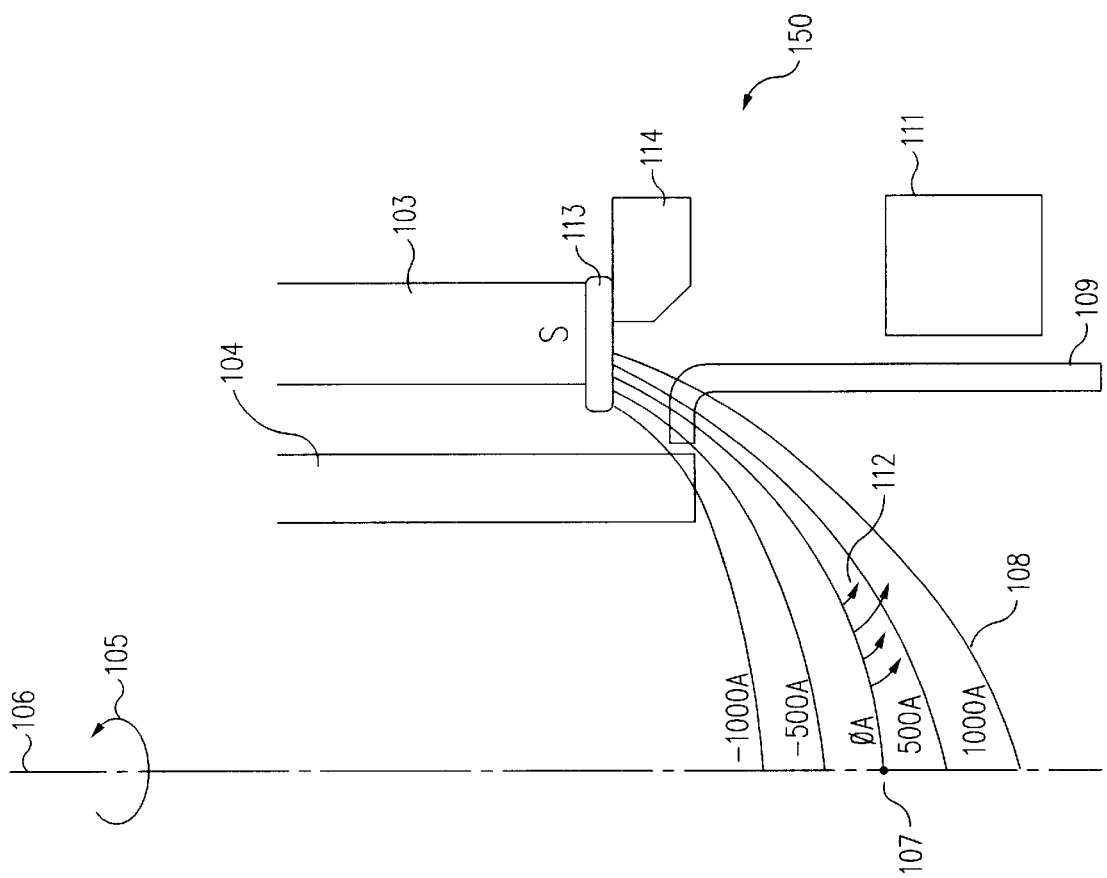
FIG. 2 shows how the separatrix is affected by varying the current through the coil.

Because HCM 150 can sustain a high density plasma, atoms sputtered from target 104 will have a high probability of becoming ionized. Thus, plasma escaping out of container 120 will mostly consist of ions and electrons which are affected by magnetic fields. By varying the shape of the magnetic fields of magnetic stack 103, the plasma escaping from container 120 can thus be directionally controlled. A coil 111 is placed at a distance from the opening of cathode 110 to vary the shape of the separatrix (i.e., field line 108). As shown in FIG. 2, by adjusting the current through coil 111, thereby varying the strength of its magnetic field, the shape of the separatrix and plasma flow indicated by arrows 112 can be controlled. A coil current in the order of ±0 to 5A, which corresponds to ±0 to 2500 Amp-turns, can change the plasma flow from a highly focused beam to a widely spread profile. Thus, by varying the magnetic field strength of coil 111, the profile of the plasma streaming onto the substrate can be controlled to achieve a desired deposition uniformity. It is to be noted that deposition uniformity is extremely sensitive to the current in coil 111. For titanium deposition, for example, a mere variation of 0.05 to 0.1A (10 to 20 Amp-turns) in coil current can cause a significant change in uniformity. The practitioner must therefore try different values of coil current in order to get the best uniformity for a given application.

Coil 111 can be used to control the plasma profile because the separatrix serves as a "lens element" in spreading or focusing the plasma escaping from container 120. This lens element effect is similar to ion extraction through an orifice where the electric field near the orifice operates as an aperture for the plasma. For the magnetic configuration shown in FIGS. 1 and 2, the separatrix operates as a diverging lens that spreads out the plasma streaming out of container 120. As shown in FIG. 2, the higher the coil current, the further magnetic null 107 moves away from the opening of cathode 110. A bottom pole piece 113 is used to minimize the movement of the ends of the separatrix with varying coil current. Because the ends of the separatrix remain relatively fixed on bottom pole piece 113 while magnetic null 107 moves, coil 111 is essentially a control "knob" for varying the "focal length" of the separatrix "lens" to control plasma flow from container 120. As FIG. 2 indicates, plasma spreads out more as coil current is increased.

Using the teachings of the present invention, it is thus possible to engineer the shape of the separatrix by using different configurations to optimize the uniformity and profile of the escaping plasma for processes in addition to physical vapor deposition. For ion implantation applications, for example, an ion source may incorporate the teachings of this invention to have a flat or concave separatrix in order to focus the escaping plasma into a tight spot for ion extraction. The concept of the separatrix acting as a single aperture lens in a cusp mirror for plasma extraction should also find uses in other plasma source designs that have a similar magnetic geometry.

As is evident to one of ordinary skill in the art, the present invention can be employed without regard to the number and type of magnets used for shaping the separatrix lens. For example, multiple magnets can be individually controlled and located between the cathode and the substrate to focus the escaping plasma. This is analogous to using multiple lenses in collimating light beams. Further, permanent magnets with predetermined field strengths can also be used in lieu of electromagnets.

The cathode, the reactor, and the plasma therebetween comprise an electrical circuit. The impedance of this electrical circuit is commonly referred to as discharge impedance. Discharge impedance is directly related to the amount of free electrons in the plasma: the more free electrons in the plasma, the lower the discharge impedance. It has been observed that magnetic fields from coil 111 affect the discharge impedance. Depending on the direction of the current in coil 111, the magnetic fields produced by coil 111 will either aid or "buck" field lines 101 produced by magnetic stack 103. In an aiding configuration (i.e., field lines 101 are strengthened), coil 111 increases the discharge impedance. On the other hand, in a bucking configuration, coil 111 decreases the discharge impedance. Care must be taken such that the discharge impedance is not increased to the point where the plasma is no longer sustainable. In an aiding configuration, for example, the residual magnetic fields of magnetic stack 103 can be decreased such that the "mirror effect" is not achieved. This leads to a decrease in plasma confined within container 120, an increase in the spread of plasma escaping out of container 120, and corresponding increase in discharge impedance to a point where plasma is no longer sustainable.

With the above caveat regarding the effect of coil 111 to the discharge impedance, it has been observed that using coil 111 in an aiding configuration promotes good deposition uniformity. However, in applications where ionization efficiency is more important than uniformity, using coil 111 in a bucking configuration maximizes plasma confinement. Maximizing plasma confinement within container 120 results in higher ionization levels of sputtered metal atoms because there are more ions available for ionization. From the foregoing, one of ordinary skill in the art will appreciate that utilizing one bucking magnet near the target and one aiding magnet near the substrate would provide both high ionization efficiency and good process uniformity across the substrate.

As can be seen in FIG. 2, there is still a slight movement of the separatrix from the opening of target 104 and towards anode 109 as the current in coil 111 is increased. In general, as magnetic field lines connect a portion of the cathode directly to the anode, electron confinement within the cathode decreases which leads to an increase in discharge impedance. In other words, as the separatrix begins to intercept the anode, the discharge impedance would increase due to premature loss of primary electrons. Thus it is preferable for the separatrix to intersect cathode 110 rather than anode 109. To ensure full face erosion of target 104, a highly desirable result, it is also preferable to have the separatrix intersect cathode 110 as close to its opening as possible.

It is also advantageous to place coil 111 at a distance further away from the opening of cathode 110 to minimize the movement of the ends of the separatrix from pole piece 113 and maximize coil 111's effect of bending the separatrix. The placement of coil 111 relative to the bottom of main magnetic stack 103 has a major effect on deposition uniformity. The farther coil 111 is from main magnetic stack 103 (i.e., the closer coil 111 is to substrate 2), the better the deposition uniformity. This is consistent with the theory that the separatrix acts as a magnetic lens element and the distance between coil 111 and main magnetic stack 103 determines the shape of the separatrix and, thus, the lens' focal length.

Pole piece 113 should be positioned as close to, but radially away from, the plane defined by the opening of cathode 110. This is to minimize movement of the separatrix with varying current in coil 111. In cases where it is not possible to put pole piece 113 close enough to the opening of cathode 110, an anode which includes a piece made of soft magnetic materials can be used. This anode, for example, can consist of a magnetic piece and a non-magnetic piece sealed in-between by an o-ring. The magnetic and non-magnetic pieces can also be welded together to eliminate the o-ring and any possible seams in-between. In FIG. 3A, the inlet hardware for a water-cooling jacket 4 prevents a bottom pole piece 205 from being placed as optimally as possible near the opening of a target 3. Thus, an anode 208 is fabricated using a magnetic piece 204B and a non-magnetic piece 204A. It is to be noted that magnetic piece 204B, although manufactured as part of anode 208, is effectively a magnetic pole piece. The portion of anode 208 which actually functions as an anode is the non-magnetic piece 204A. As is known in the art, a magnetic material, such as magnetic piece 204B, provides a path of least resistance for magnetic fields. Thus, field lines from the main magnetic stack will be steered into magnetic piece 204B which is near the opening of target 3.

Figure 3:
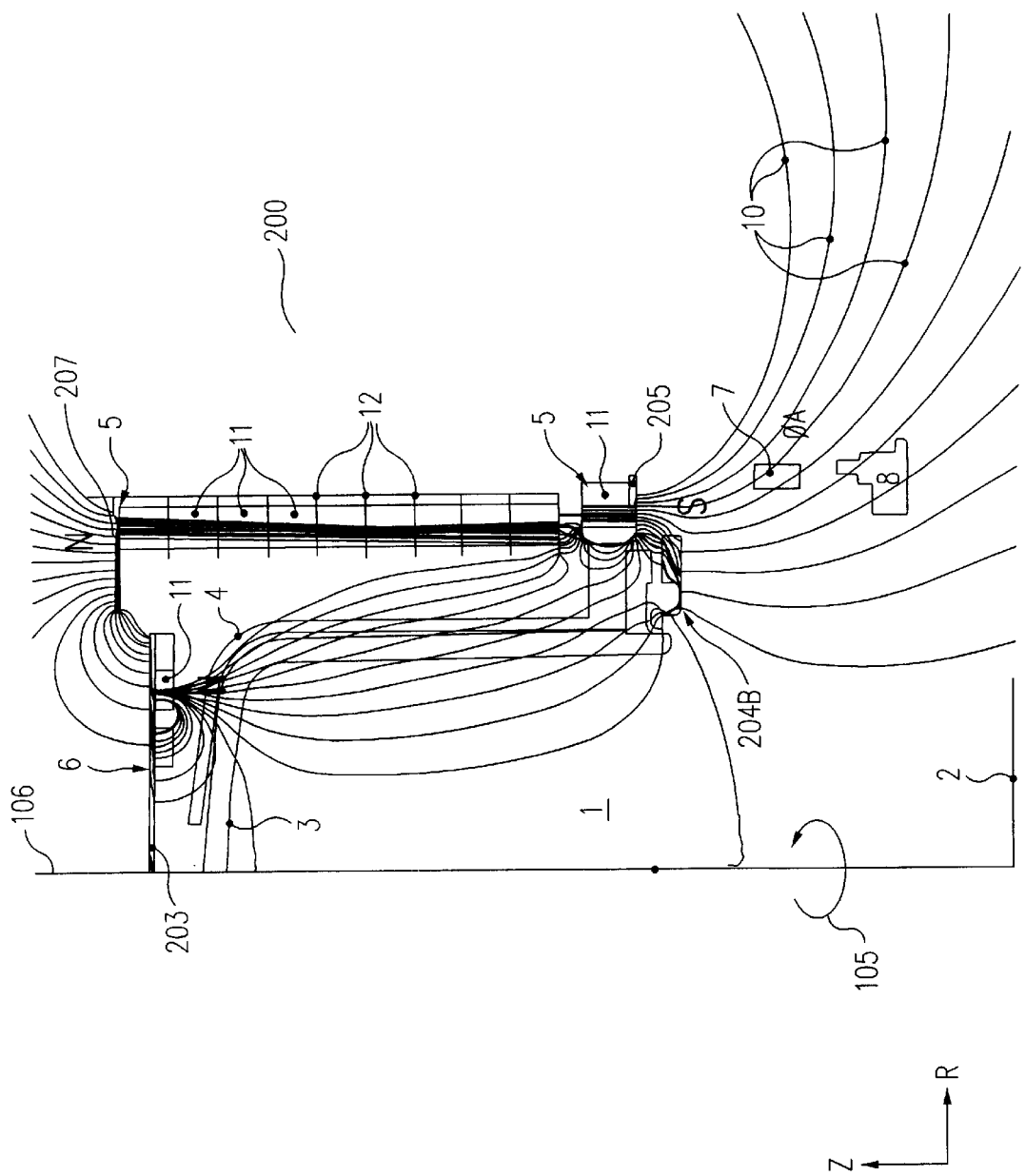
FIGS. 3 and 3A show a magnetically non-shielded hollow cathode magnetron source according to the present invention.
Figure 3A:
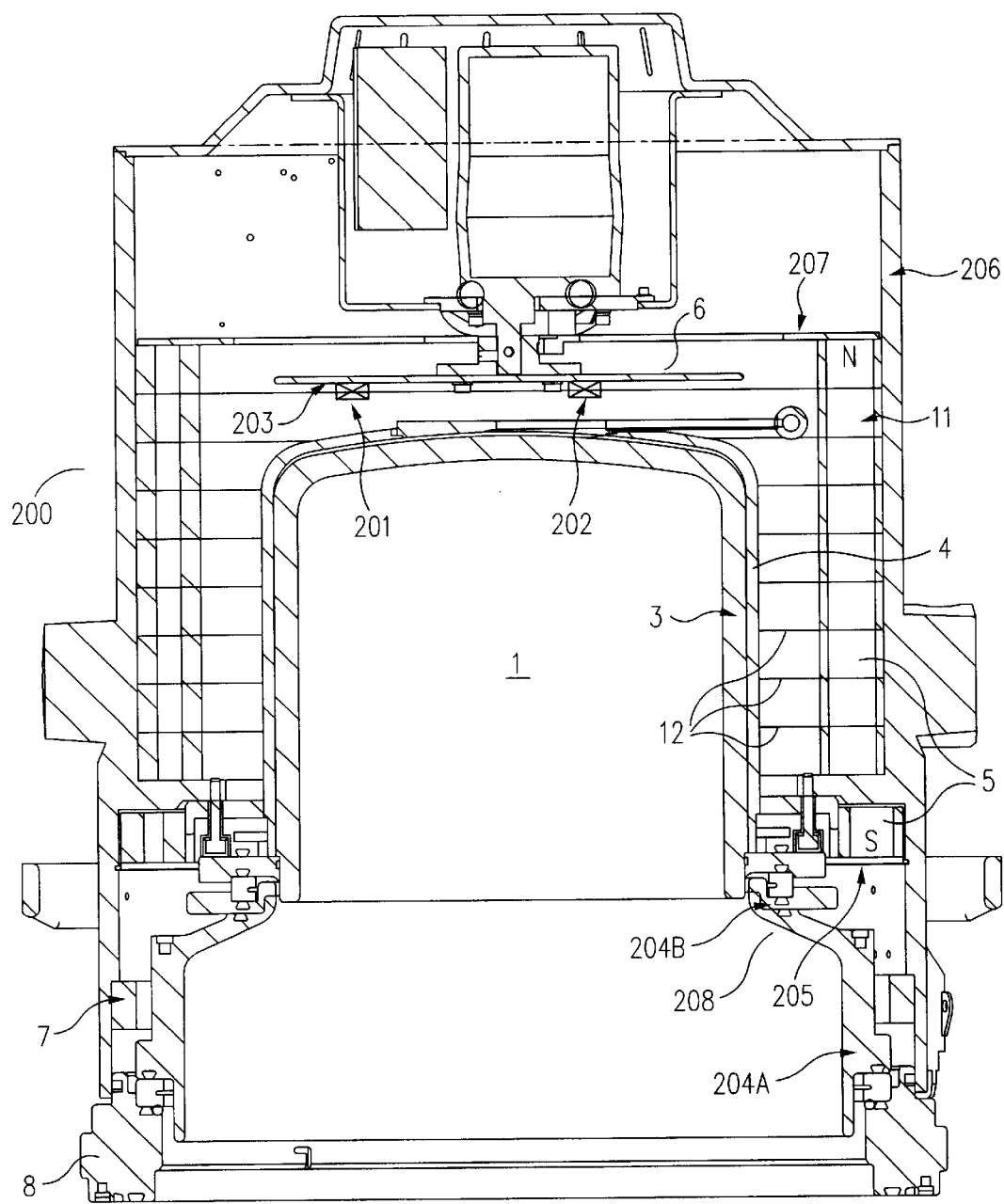

FIGS. 3 and 3A show an HCM 200 according to the present invention. Referring to FIG. 3, HCM 200 includes a side permanent magnet array 5 wherein the bottom is an effective south pole and the top is an effective north pole. Side permanent magnet array 5, which produces the main magnetic flux in this source configuration, consists of magnets 11 stacked in-between iron shims 12. Magnets 11 are oriented to generate magnetic flux in the axial (or Z) direction. Top pole piece 207 and bottom pole piece 205 are placed on the north and south sides of permanent magnet array 5, respectively, to direct and focus magnetic field lines. Also shown is a rotating magnet array 6 as described in commonly-owned U.S. Provisional Application No. 60/114, 888, which is incorporated herein by reference in its entirety. As shown in FIG. 3A, rotating magnet array 6 includes a rotating pole piece 203, a magnet set 201, and a magnet set 202. Rotating magnet array 6 is provided to enhance the erosion profile of target 3. As previously explained, a magnetic coil 7 in a preferred aiding configuration controls the shape of the separatrix to obtain good deposition uniformity on substrate 2 while maintaining a high density plasma within target 3. Magnetic field lines 10 are shown in FIG. 3 for a case where no current is applied through coil 7.

As shown in FIGS. 3 and 3A, HCM 200 also includes water-cooled jacket 4 for cooling the cathode and adapter 8 for connecting anode 208 to the process chamber or reactor. Outer shell 206 encloses source 200 and is made of non-magnetic material in this particular embodiment. Volume 1 represents the container portion of HCM 200.

From the teachings of the present invention, it is clear that there are many ways to achieve an equivalent or similar magnetic configuration for an HCM other than the stack of cylindrical magnets described in Helmer. A drawback of using a stack of cylindrical magnets is that magnetic field lines extend far beyond the HCM. These leaking magnetic field lines can pose problems for other components nearby that are sensitive to varying weak magnetic fields. With axially configured main magnets, such as magnetic stack 103 and magnet array 5, a magnetic housing cannot be readily employed for shielding purposes. This is because the magnetic housing will substantially interfere with axially oriented magnetic fields. One solution to the problem is to use a magnetic housing having a surface which is far enough from the main magnet. Another solution is to use magnets which magnetic fields are oriented substantially normal to the plane of the magnetic housing. Using electromagnets to generate the main magnetic flux also allows for the use of a magnetically shielded housing. In such configuration, the magnetic housing becomes a part of the magnetic circuit and can be taken into account accordingly.

Figure 4:
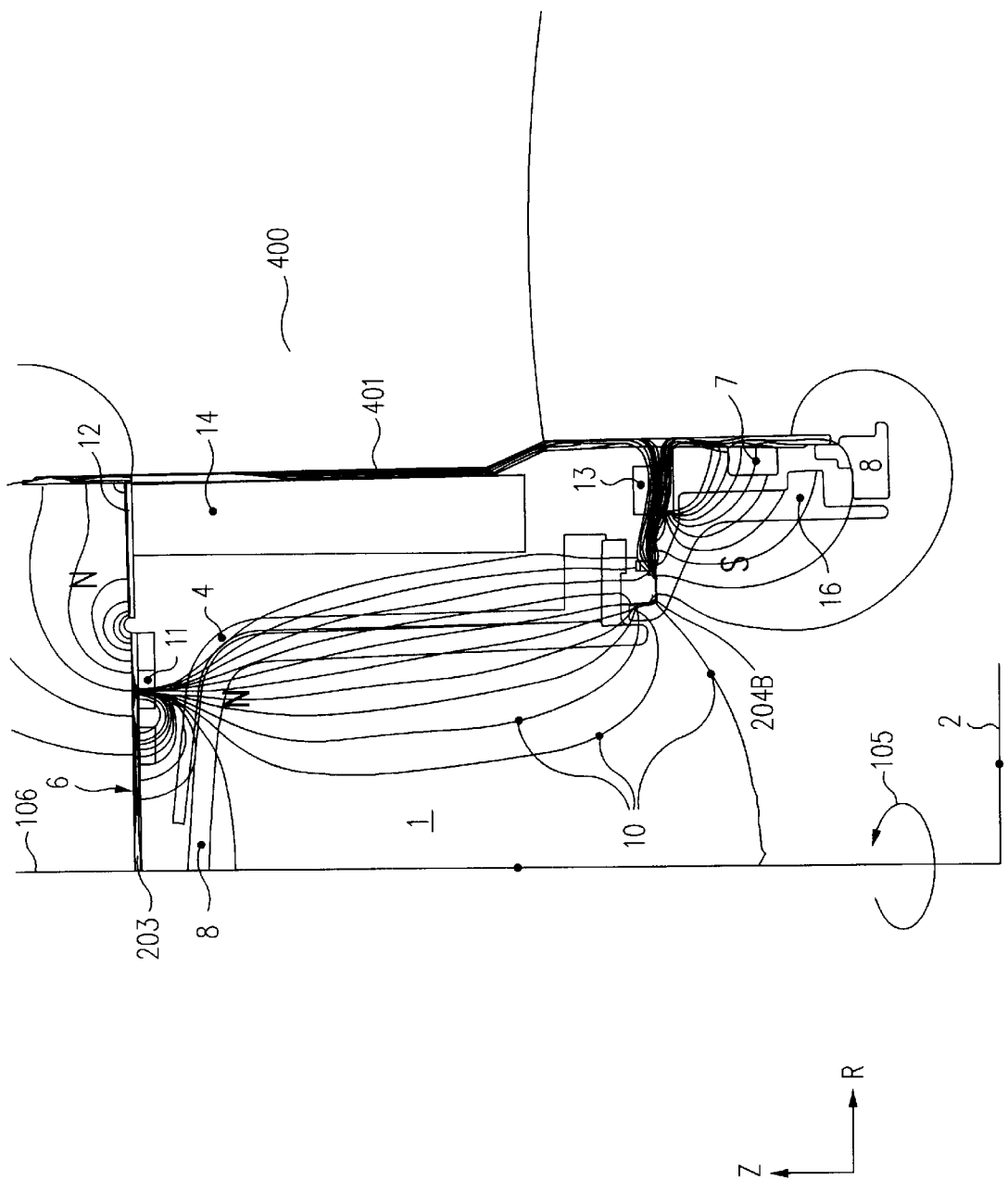
FIG. 4 shows a magnetically shielded hollow cathode magnetron source according to the present invention.

FIG. 4 shows a magnetically shielded HCM 400 according to the present invention. Instead of using axial permanent main magnets, one or more electromagnet coils 14 are used to generate magnetic field lines 10. Power supplies (not shown) are used to supply a fixed or variable current through coils 14. Coils 14 can also be turned on and off during processing. In order to control the position of the separatrix, a radially-charged array of permanent magnets 13 is placed behind magnetic piece 204B near the opening of target 3. Magnets 13 can also be in-contact with magnetic piece 204B. Magnetic piece 204B is positioned on top of a non-magnetic anode piece 16. Anode piece 16 can be electrically floating, grounded, or biased. Outer shell 401, which is made out of a soft magnetic material, is provided around the outer diameter of HCM 400 to prevent magnetic flux leakage. Coil 7 is placed downstream of target 3 to control the shape of the separatrix, thereby controlling the plasma confinement properties of HCM 400 and deposition uniformity on substrate 2.

Figure 5:
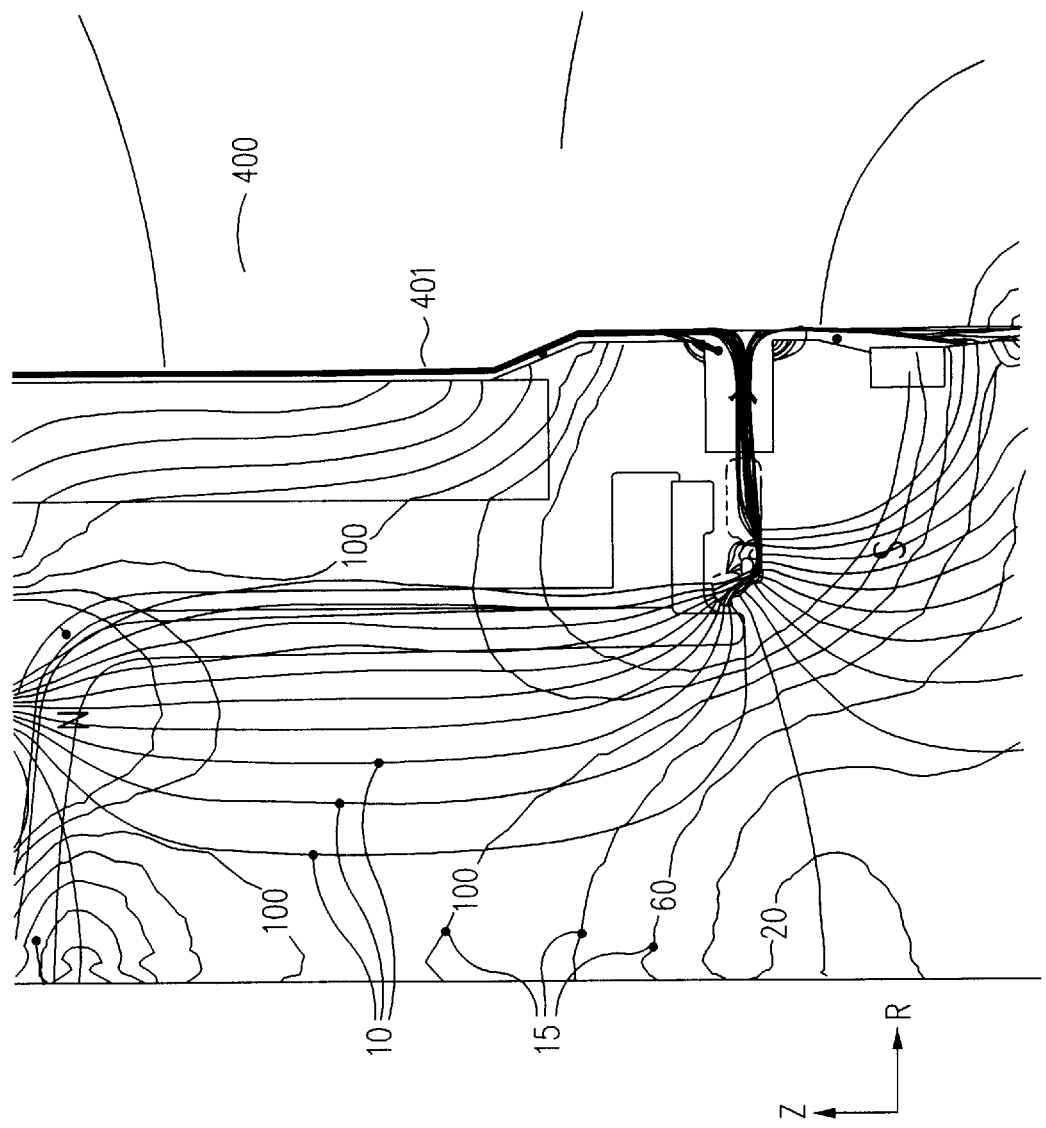
FIG. 5 shows a magnetostatic simulation plot for the magnetron source shown in FIG. 4.

FIG. 5 shows a typical magnetostatic simulation of the shielded HCM 400. In FIG. 5, magnetic field strength values are shown in units of Gauss. Contours 15 indicate the magnitude of the magnetic field, |B|. Contours 15 are from a solution of Maxwell's equations. As can be seen in FIG. 5 and other simulation plots in this disclosure, contours 15 tend to be orthogonal to field lines 10. Because the entire magnetic structure is enclosed within magnetic outer shell 401, which also serves as a return for the magnetic field lines outside the target area, very little magnetic field leaks outside of HCM 400.

Figure 6:
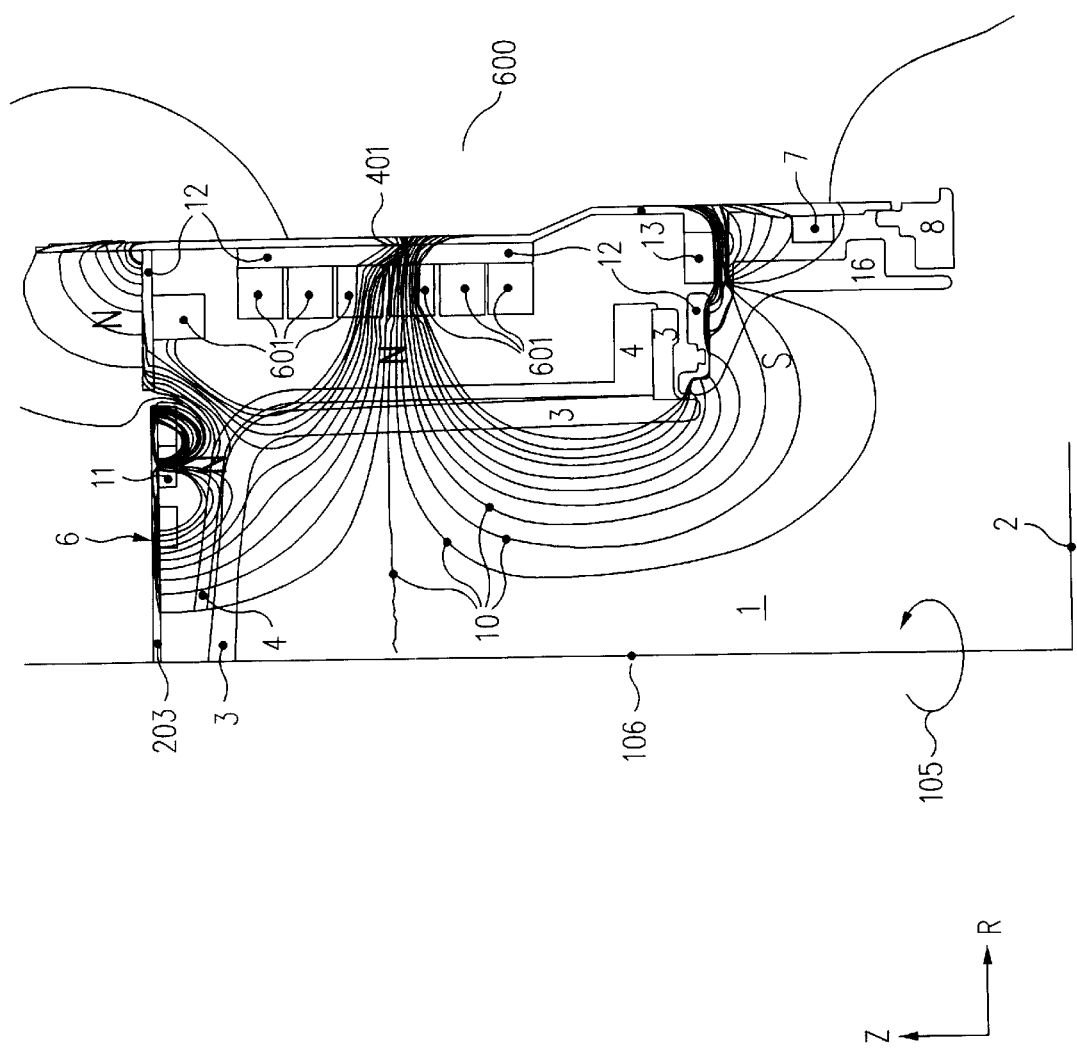
FIG. 6 shows a magnetically shielded hollow cathode magnetron source according to the present invention wherein the main magnet is an array of radially-charged permanent magnets.

FIG. 6 shows another magnetically shielded HCM 600 where an array of radial magnets 601 is used to create the main magnetic fields. Radial magnets 601 are oriented to produce magnetic flux in the radial direction. In FIG. 6, outer shell 401 is made of a magnetic material to prevent magnetic flux leakage. The same configuration can be used in a non-shielded configuration by making outer shell 401 out of a non-magnetic material.

Figure 7:
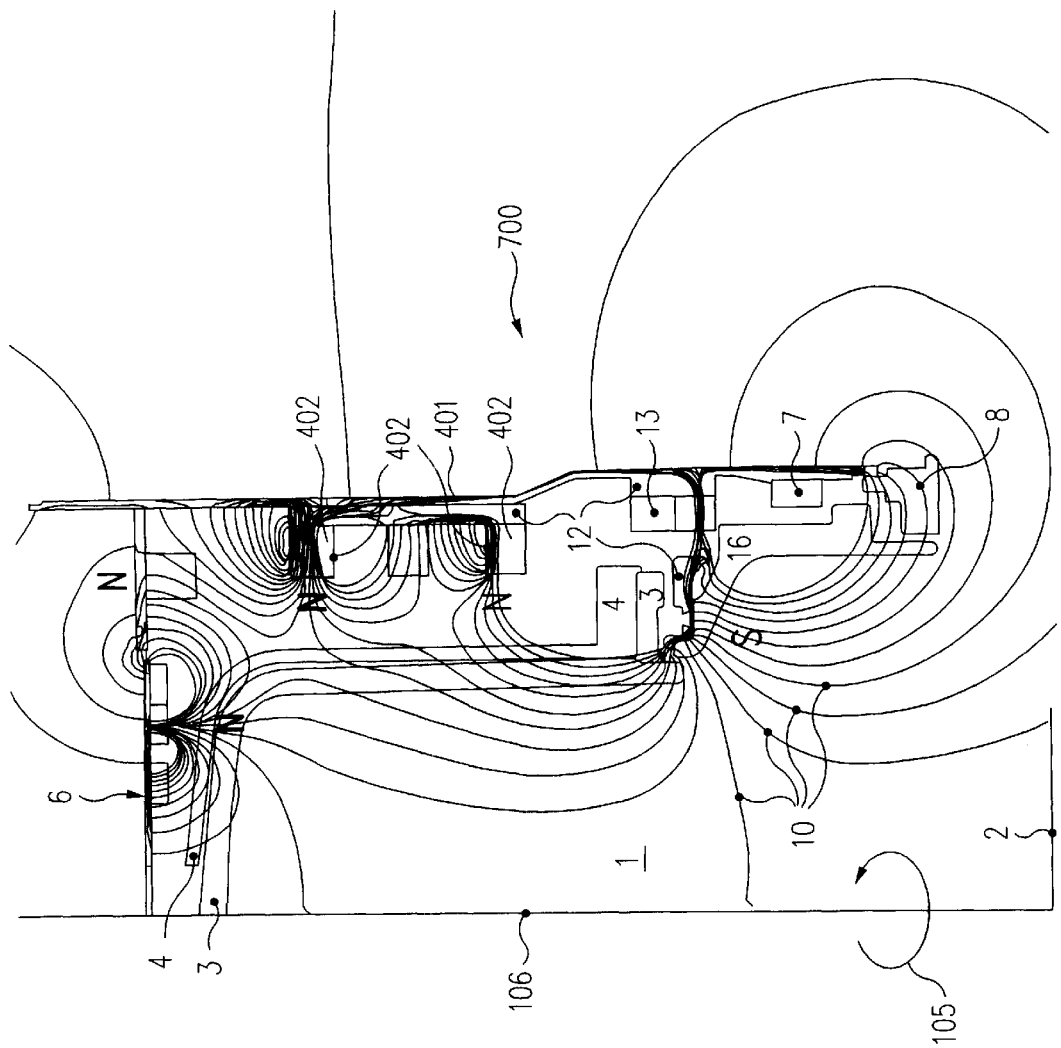
FIG. 7 shows a magnetically shielded hollow cathode magnetron source according to the present invention wherein the main magnet is an array of permanent magnets which are radially located on a pole piece.
Figure 8:
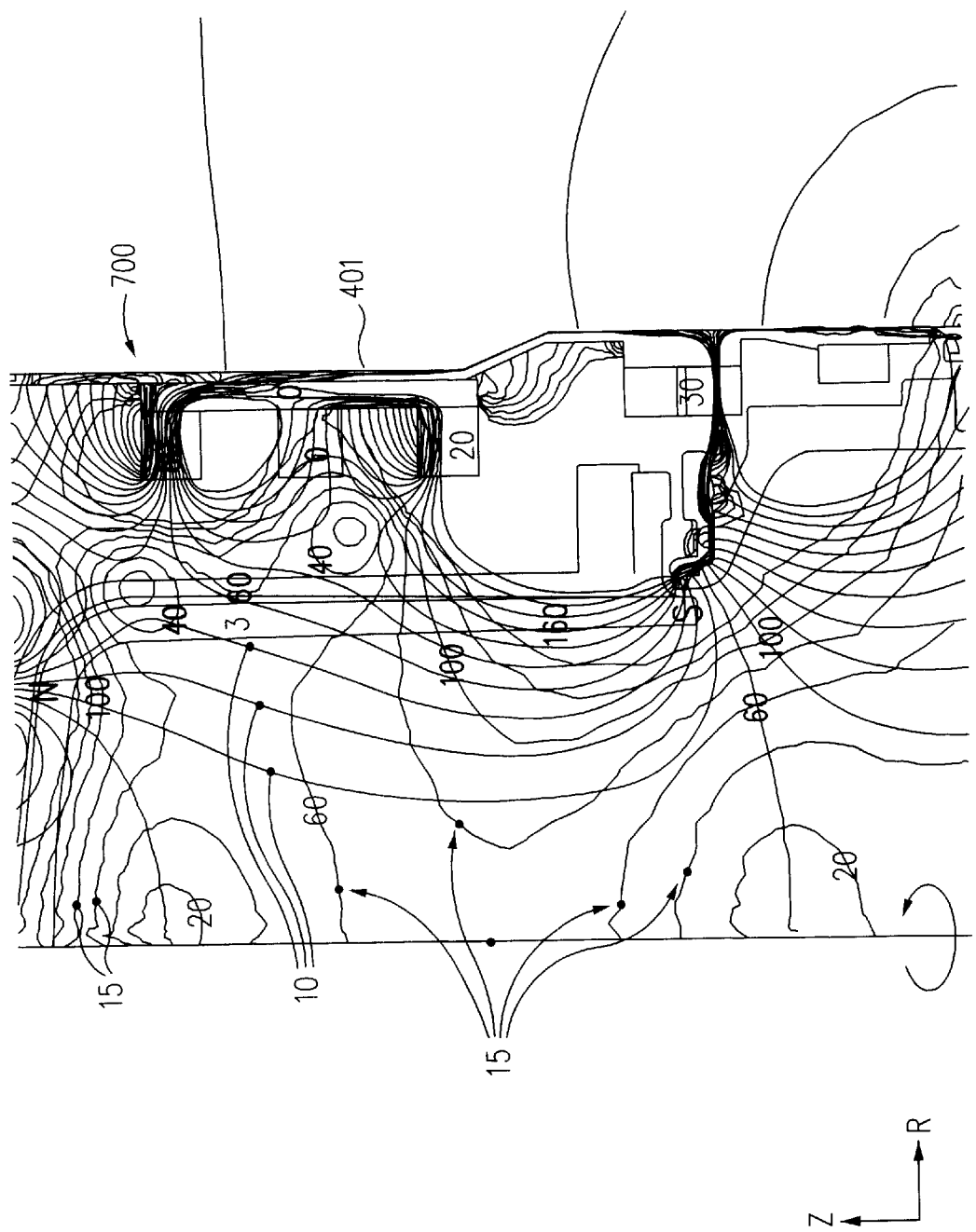
FIG. 8 shows a magnetostatic simulation plot for the magnetron source shown in FIG. 7.
Figure 9:
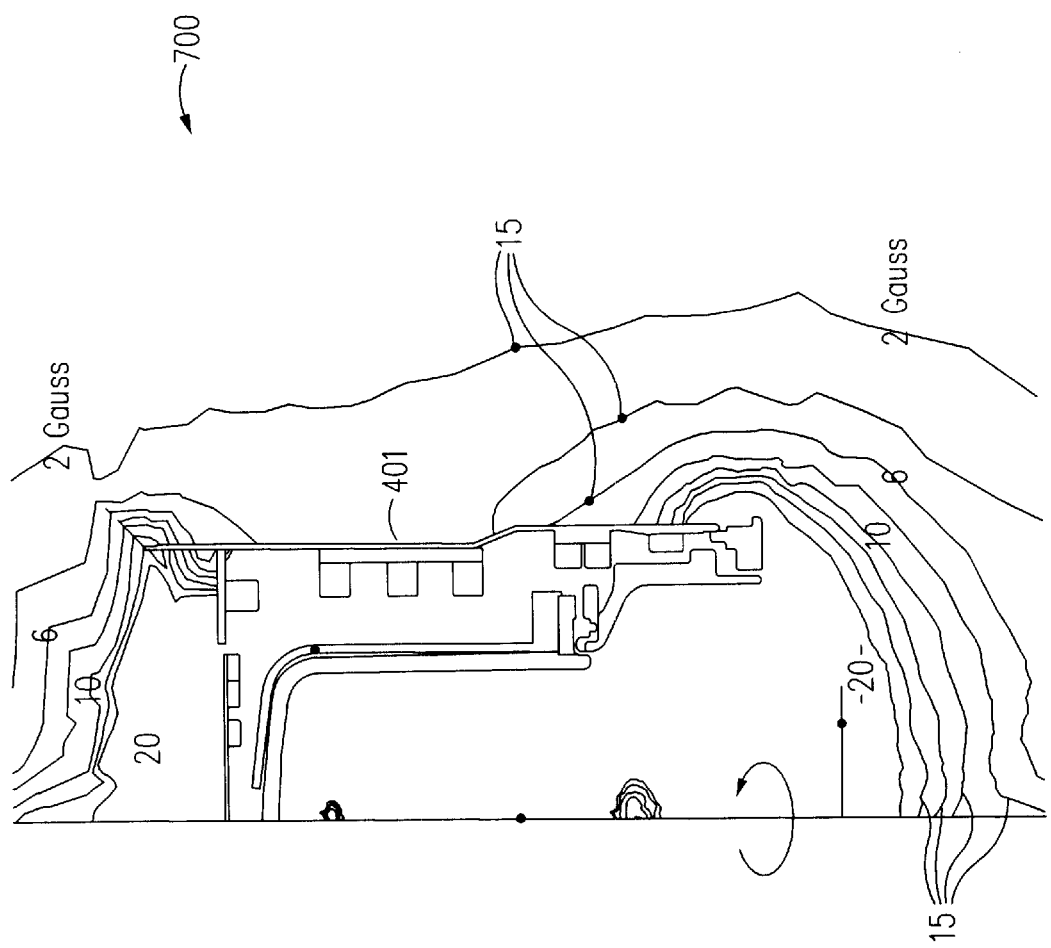
FIG. 9 shows the magnetic leakage outside the magnetron source shown in FIG. 7.

FIG. 7 shows a variation of HCM 600. In magnetically shielded HCM 700, permanent magnets 402 are radially located on a pole piece. FIG. 8 shows a magnetostatic simulation for HCM 700 while FIG. 9 shows the corresponding magnetic flux leakage. As in HCM 400 and HCM 600, very little magnetic fields leak outside HCM 700 because outer shell 401 is made of a magnetic material.

Figure 10A:
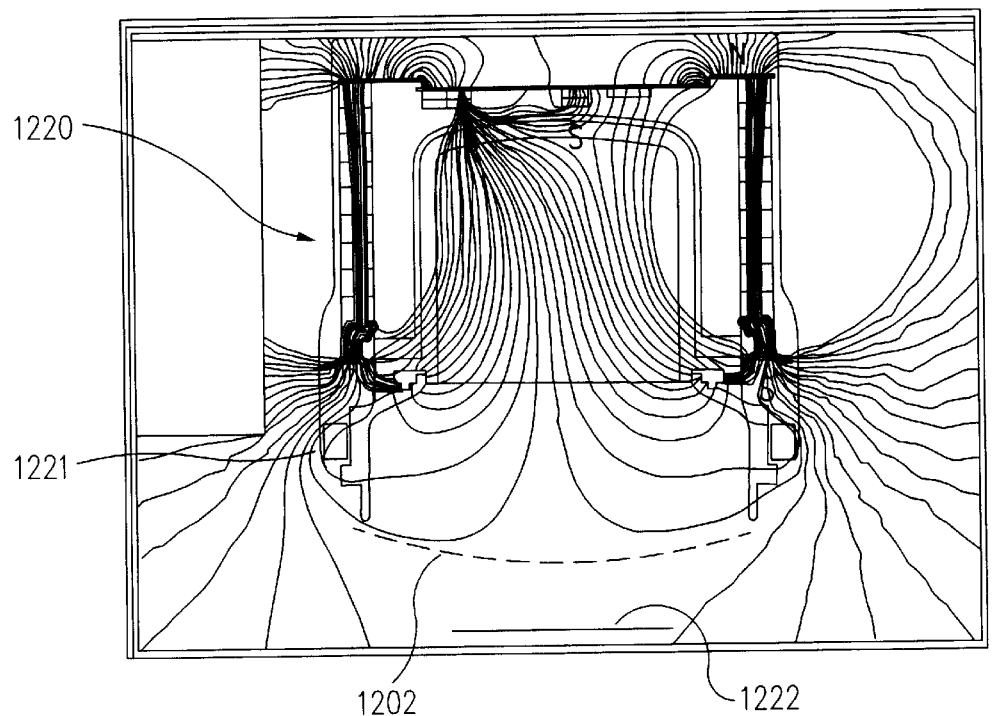
FIGS. 10A and 10B show schematic diagrams of hollow cathode magnetrons (HCMs) used in physical vapor deposition (PVD) experiments.
Figure 10B:
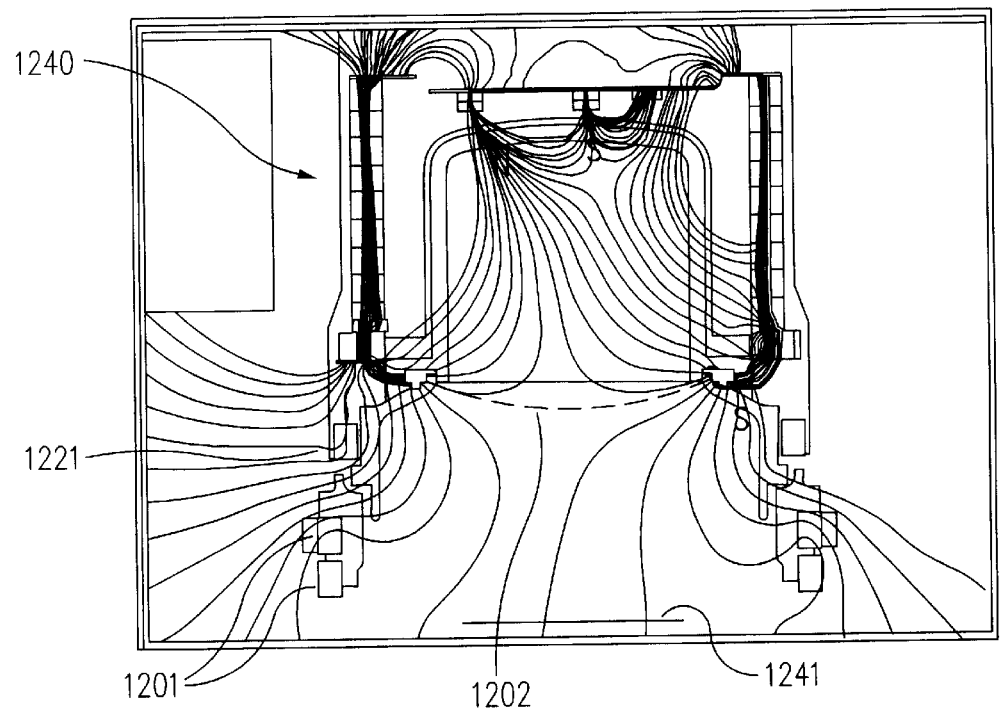

As discussed above, high ionization efficiency and good process uniformity across the substrate can both be achieved by utilizing one magnet near the target and another magnet near the substrate. FIGS. 10A and 10B show schematic diagrams of hollow cathode magnetrons (HCMS) used in two physical vapor deposition (PVD) experiments. The first experiment (hereinafter "single coil experiment") was a PVD of copper using an HCM 1220 having a coil 1221 near the opening of the target as shown in FIG. 10A. The second experiment (hereinafter "dual coil experiment") was a PVD of copper conducted using an HCM 1240 having a coil 1221 near the target and coils 1201 near a substrate 1241 as shown in FIG. 10B.

Figure 10C:
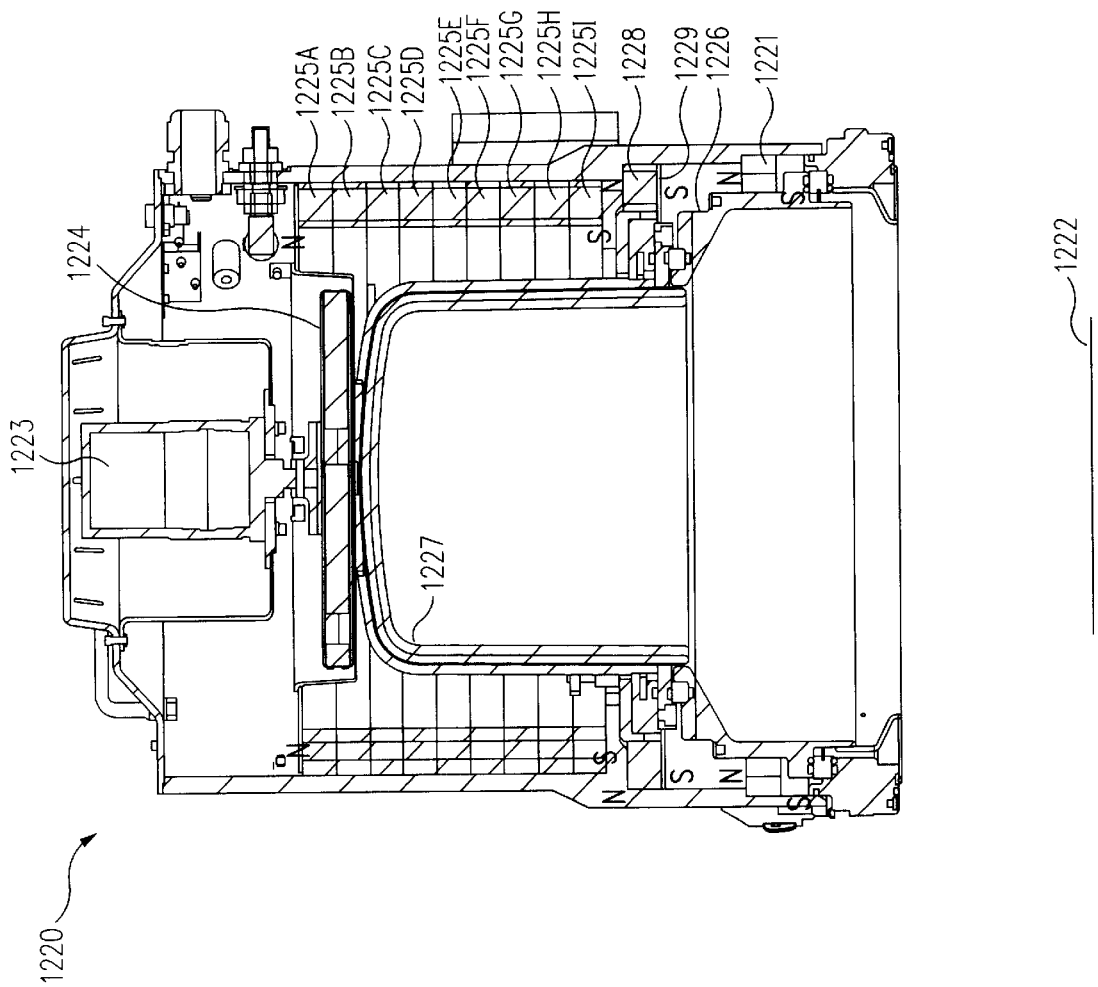
FIG. 10C shows further details of the HCM shown in FIG. 10A.
Figure 10D:
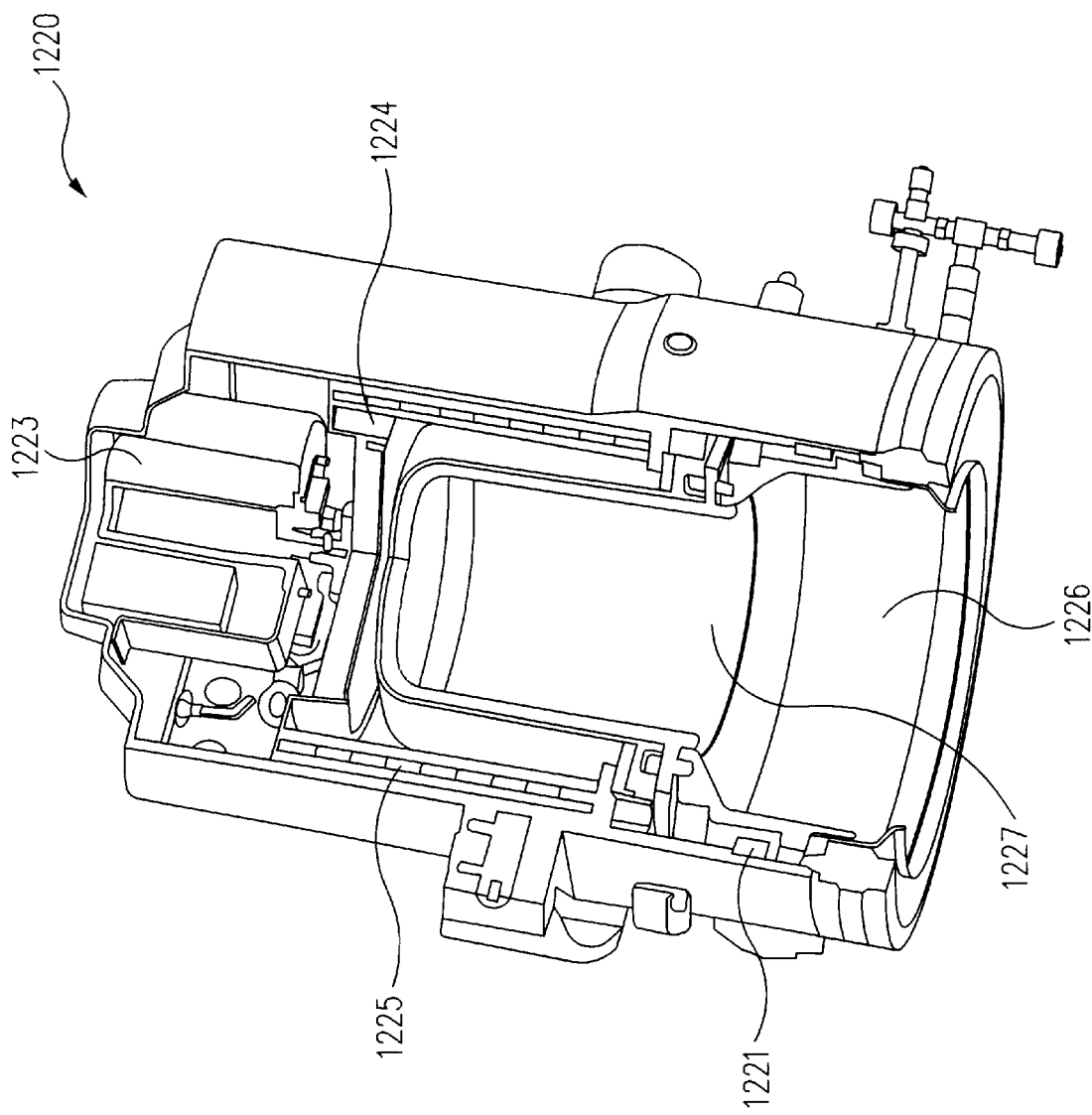
FIG. 10D shows a three-dimensional cut-away view of the HCM shown in FIG. 10A.

FIG. 10C shows further details of HCM 1220 used in the single coil experiment while FIG. 10D shows a three-dimensional cut-away view of HCM 1220. In HCM 1220, which is of the same type as HCM 150 described above, a coil 1221 controls the shape of the separatrix in the same manner as coil 111 of HCM 150. Referring to FIG. 10C, HCM 1220 has a main magnetic stack 1225 consisting of cylindrical magnets 1225A–1225I that are stacked one on top of another. Each of cylindrical magnets 1225A–1225I has its magnetic north facing away from the substrate and its magnetic south facing towards the substrate. A magnet 1228 and a pole piece 1229 extend the magnetic fields from main magnetic stack 1225 such that a separatrix is formed in the vicinity of the opening of a target 1227, which is of copper. Each of magnets 1225A–1225I and magnet 1228 has embedded neo (Neodymium-Iron-Boron) magnets that are arranged in symmetrical fashion. An anode 1226 is electrically floating. A motor 1223 rotates a magnet 1224 to enhance the erosion profile of target 1227 as described in US Provisional Application No. 60/114,888 and U.S. patent application Ser. No. 09/375,667 now U.S. Pat. No. 6,193,854 entitled "Apparatus And Method For Controlling Erosion Profile In Hollow Cathode Magnetron Sputter Source," both of which are incorporated herein by reference.

In the single coil experiment using HCM 1220, magnets 1225A–1225D and magnet 1228 each had 15 neo magnets while magnets 1225E–1225I each had 20 neo magnets. Coil 1221, a Helmholtz coil, was configured in an aiding configuration (i.e., its top side, which faces magnet 1225I, was configured as magnetic north). The parameters used in the single coil experiment were as follows:

(a) DC bias power applied at the cathode was 30 kw;
(b) argon flow rate was 30 sccm;
(c) reactor pressure was 2.5 mTorr;
(d) current through coil 1221 was 1089 amp-turns.

Figure 10E:
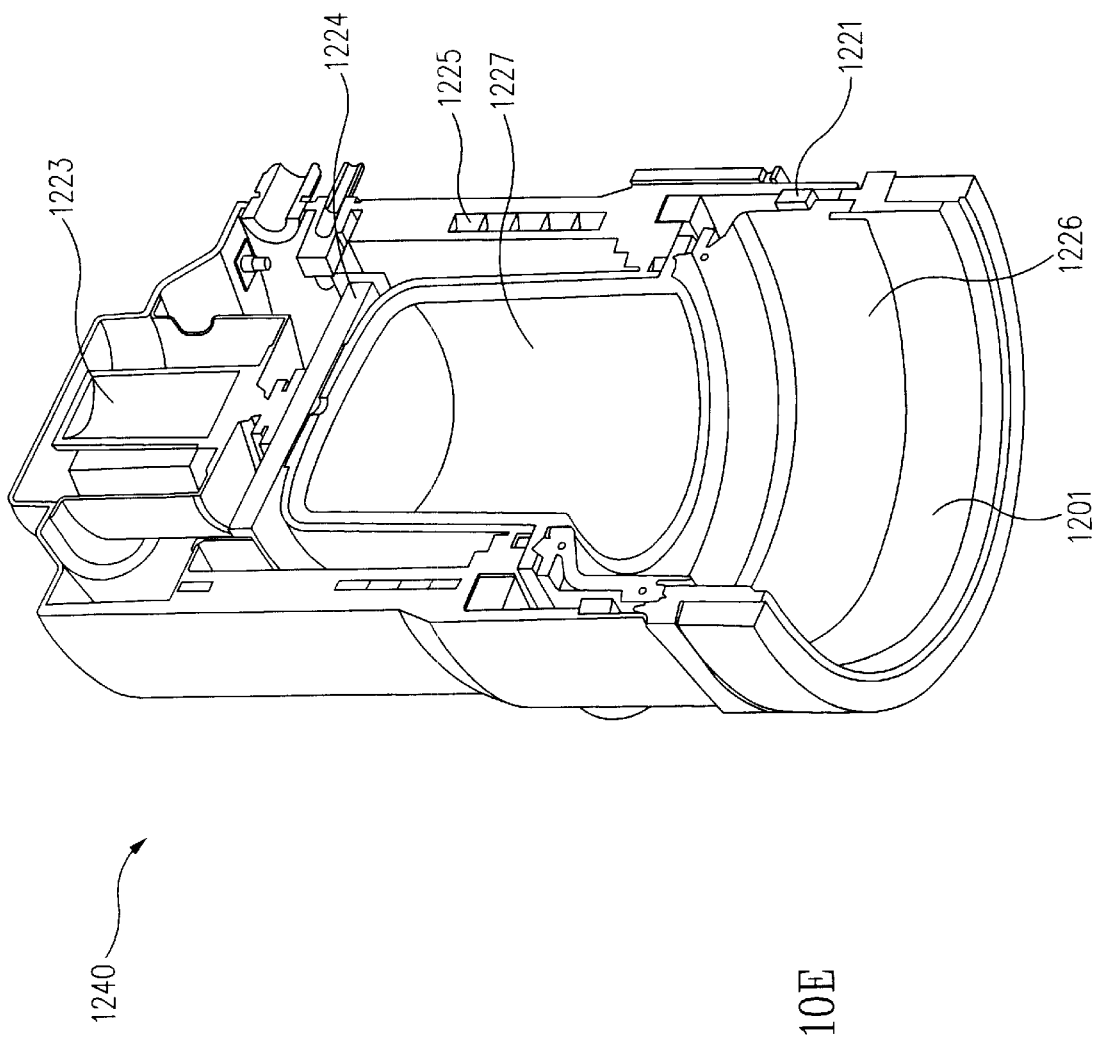
FIG. 10E shows a three-dimensional cut-away view of the HCM shown in FIG. 10B.

The dual coil experiment was conducted using HCM 1240 shown in FIG. 10B. As shown in FIG. 10E, a three dimensional cut-away view of HCM 1240, HCM 1240 is similar to HCM 1220 except for the addition of coils 1201. While coils 1201 are depicted as two coils, persons skilled in the art can appreciate that coils 1201 can be replaced with a single coil, multiple coils in series, or multiple separate coils. Because HCM 1240 and HCM 1220 are similar except for the addition of coils 1201, FIG. 10C can be used as a guide to locate components of HCM 1240 that are not specifically shown in FIGS. 10B and 10E.

The following are the parameters for the dual coil experiment using HCM 1240:

(a) magnet 1225A was replaced with a piece of iron;
(b) magnet 1225B had 35 neo magnets;
(c) magnet 1225C had 30 neo magnets;

(d) magnet 1225D had 20 neo magnets;
(e) magnet 1225E had 20 neo magnets;
(f) magnet 1225F had 15 neo magnets;
(g) magnet 1225G had 10 neo magnets;
(h) magnet 1225H had 10 neo magnets;
(i) magnet 1225I had 10 neo magnets;
(j) magnet 1228 had 15 neo magnets and was configured with its topside (the side facing magnet 1225I) as magnetic north;
(k) Each of cylindrical magnets 1225A–1225I has its magnetic north facing away from the substrate and its magnetic south facing towards the substrate;
(l) coil 1221 and coils 1201 were Helmholtz coils;
(m) DC bias power applied at the cathode was 36 kw;
(n) argon flow rate was 30 sccm;
(o) reactor pressure was 2.5 mTorr;
(p) total current through coils 1201 was 990 amp-turns; coils 1201 were in an aiding configuration;
(q) total current through coil 1221 was 495 amp-turns and flown in a direction opposite to that of coils 1201; coil 1221 was in a bucking configuration.

FIGS. 11A and 11B show scanning electron micrographs (SEMs) of features at the center and edge, respectively, of substrate 1222 (FIG. 12A) after the single coil PVD experiment. The SEMs of substrate 1241 (FIG. 12B) after the dual coil PVD experiment are shown in FIGS. 11C and 11D for features at the center and edge, respectively, of substrate 1241. From the SEMs, it is evident that the dual coil experiment yielded better uniformity than the single coil experiment. The single coil experiment resulted in deposited copper field layer 1301 of features at the center of the substrate (FIG. 11A) being thicker than field layer 1302 of features at the edge of the substrate (11B). In contrast, the dual coil experiment resulted in deposited field layer 1303 of features at the center of the substrate (FIG. 11C) having approximately the same thickness as field layer 1304 of features at the edge of the substrate (FIG. 11D). The dual coil experiment also yielded thicker bottom coverage than the single coil experiment. This can be seen by comparing the intensity of the bright lines, which indicate the presence of deposited copper, in portions 1305 and 1306 (FIGS. 11A and 11B) with the intensity of the bright lines in portions 1307 and 1308 (FIGS. 11C and 11D). Bottom coverage in portions 1305, 1306, 1307, and 1308 were measured to be around 20%, 16%, 26%, and 24% of the thickness of the deposited field layer, respectively.

The dual coil experiment yielded better process uniformity and bottom coverage (i.e., thickness at the bottom of the feature) by providing better control of the separatrix. In the single coil experiment, coil 1221 was energized such that the separatrix, denoted in FIGS. 10A and 10B as dashed curved 1202, was located farther away from the opening of HCM 150 to achieve good process uniformity while sacrificing some ionization efficiency. In the dual coil experiment, coil 1221 was energized such that the separatrix was closer to the opening of HCM 150 to achieve high ionization efficiency while coils 1201 were energized to control the shape of the magnetic fields near substrate 1241 to achieve good process uniformity. The magnetic fields near substrate 1241 were shaped by varying the amount of current flowing through coils 1201 until the desired process uniformity (verified by measuring film sheet resistance, for example) was achieved.

Control of Magnetic Fields Near the Plane of the Substrate

Step coverage uniformity can also be improved by controlling the magnetic fields, and thus the flow of ions and electrons, near the plane of the substrate. This aspect of the present disclosure is pictorially illustrated in FIGS. 12A–12D, which show a feature 1101 in a semiconductor substrate undergoing PVD of a metal 1102 (e.g., copper).

Figure 12A:
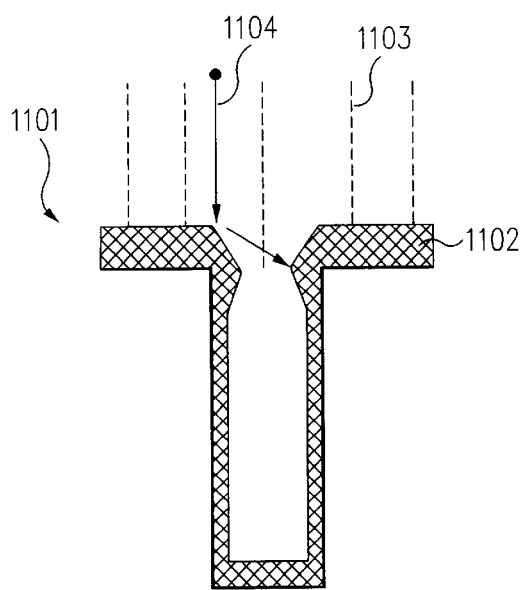
FIGS. 12A–12D pictorially illustrate the technique of controlling the magnetic fields near the plane of the substrate.

As shown in FIG. 12A, if magnetic field lines 1103 are perpendicular to the substrate, ions 1104 (e.g., copper ions, argon ions) will perpendicularly strike the substrate because the trajectory of ions follow the magnetic field lines. Ions 1104 arriving perpendicularly on feature 1101 tend to bounce off the edges and onto the top sidewalls, thereby accumulating a disproportionate amount of metal 1102 in the top opening portion of feature 1101. The accumulated metal 1102 can close off feature 1101 and prevent deposition of adequate metal 1102 on the bottom and sidewalls.

Figure 12B:
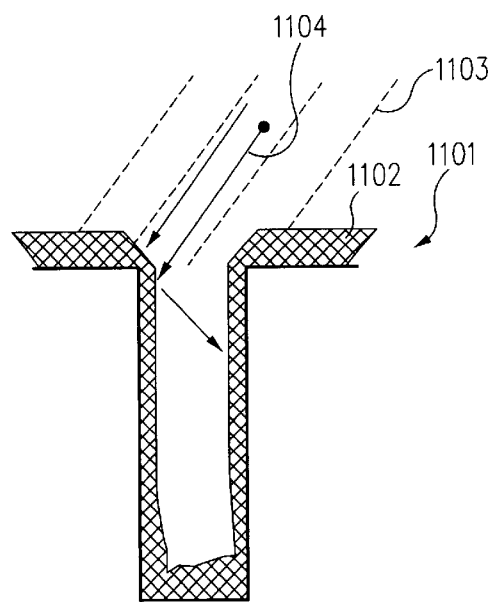

Tilting the magnetic field lines 1103 relative to the substrate, as shown in FIG. 12B, causes ions 1104 to strike feature 1101 at an angle less than 90° relative to the plane of the substrate. Magnetic field lines 1103 can be tilted, for example, by providing magnetic fields from under the substrate. Varying the strength of the magnetic fields from under the substrate adjusts the angle of the tilt. Tilting magnetic field lines 1103 has been found to prevent disproportionate accumulation of metal (overhang) 1102 in the top opening portion of feature 1101. However, tilting the magnetic field lines 1103 without rotating them also results in non-uniform deposition of metal 1102 on the bottom and sidewalls of feature 1101 (FIG. 12B).

Figure 13A:
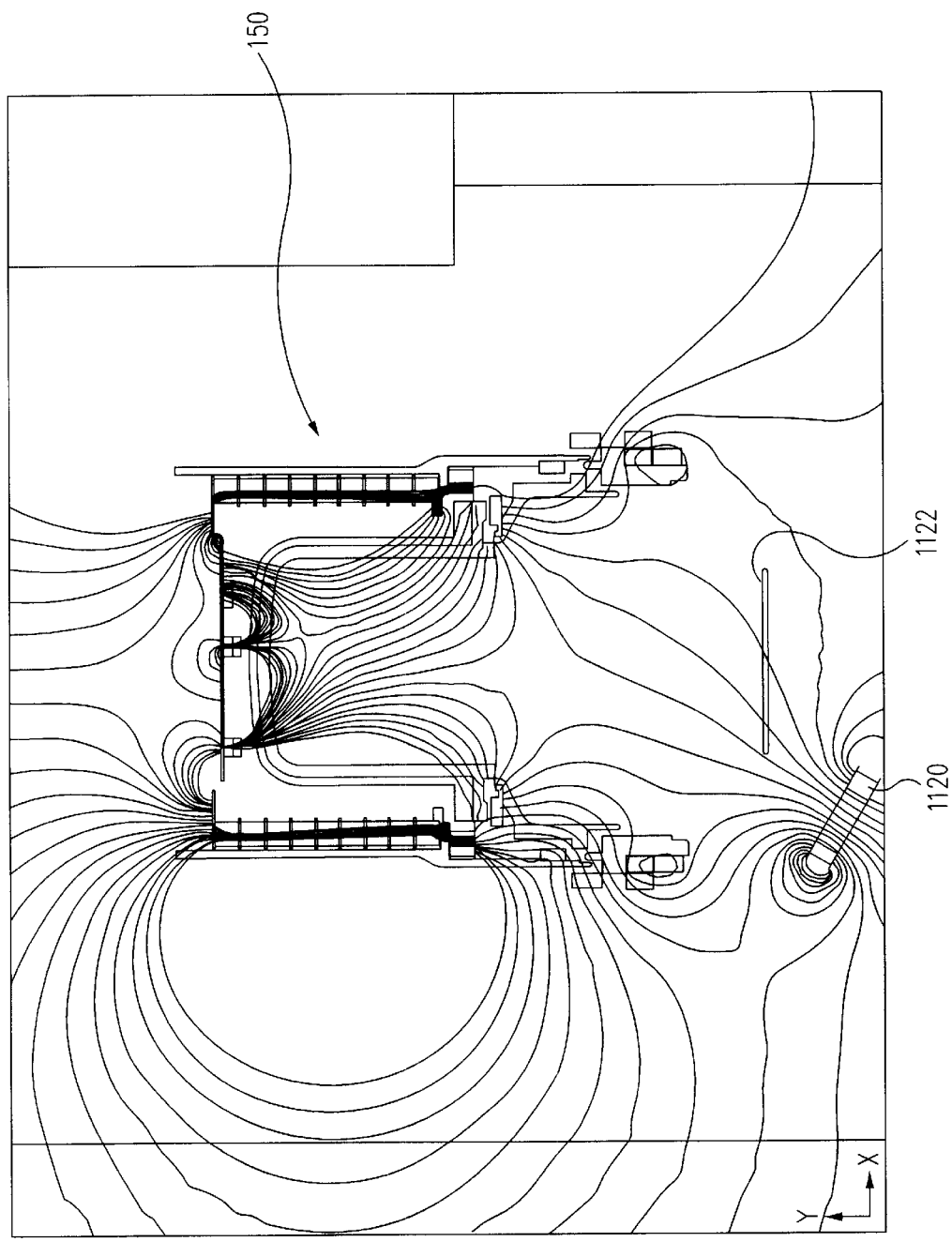
FIG. 13A shows a plot of the magnetic fields from the magnets of a hollow cathode magnetron in one experiment.
Figure 13B:
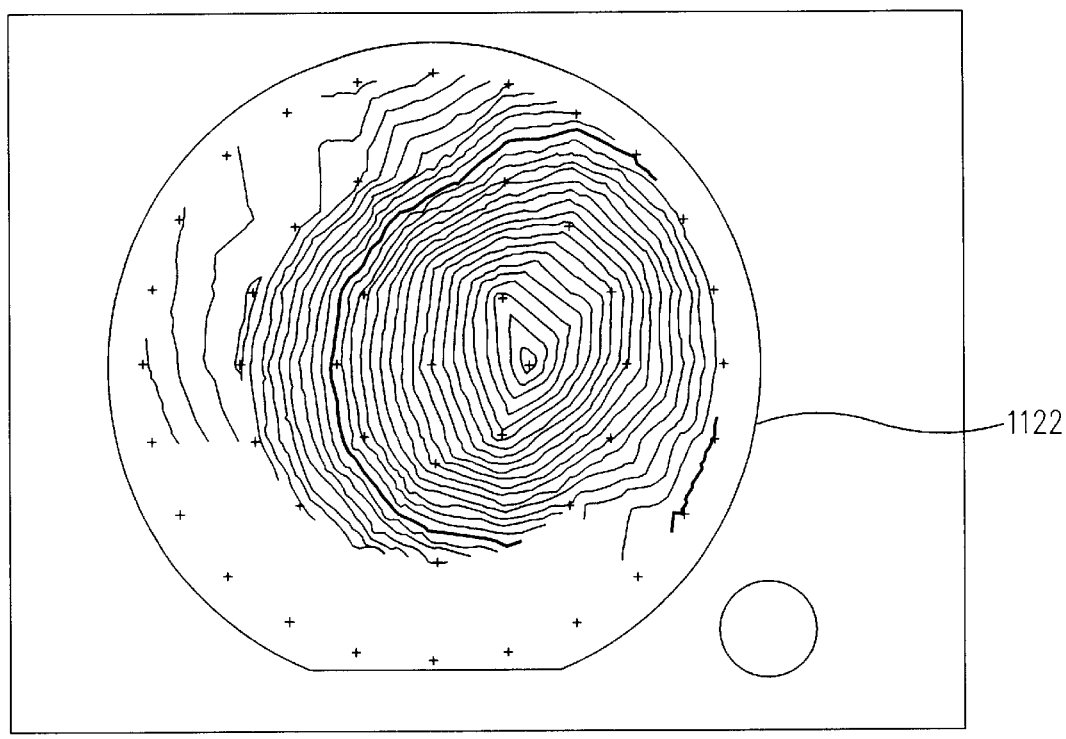
FIG. 13B shows a map of film sheet resistance of a substrate after a physical vapor deposition process using the magnetic configuration shown in FIG. 13A.
Figure 13C:
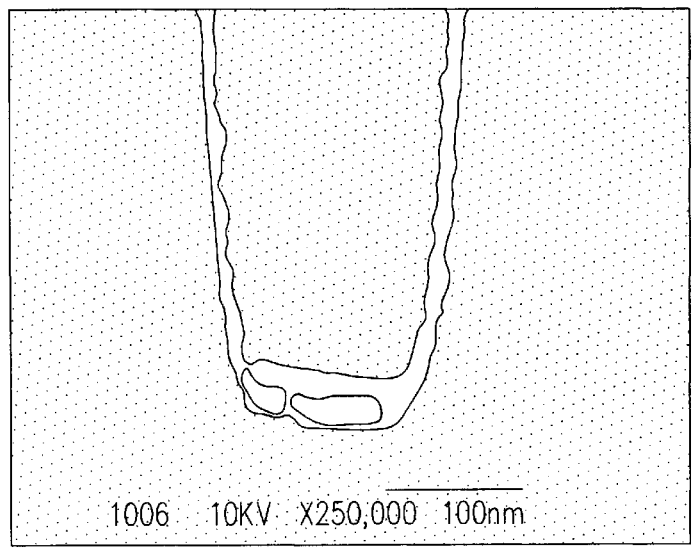
FIG. 13C shows a scanning electron micrograph of a device feature in the substrate shown in FIG. 13B.

FIG. 13A shows a plot of the magnetic fields from the magnets of HCM 150 in one experiment. In FIG. 13A, a magnet 1120 was statically located (i.e., non-rotating) on one side of a substrate 1122 to study the effect of tilted magnetic fields on process uniformity. FIG. 13B shows the resulting sheet resistance map of substrate 1122 obtained using an OMNIMAP wafer analysis tool from the Prometrix Corporation. In FIG. 13B, the closely spaced contour lines define a region with the least amount of deposited metal 1102. As is evident from FIG. 13B, the tilted magnetic fields concentrated the deposition of metal 1102 in one area of the wafer. FIG. 13C, an SEM of a narrow/high aspect ratio (0.25 $\mu$m ×1.25 $\mu$m) feature at the center of substrate 1122, shows that the tilted magnetic fields also resulted in uneven bottom coverage.

Figure 12C:
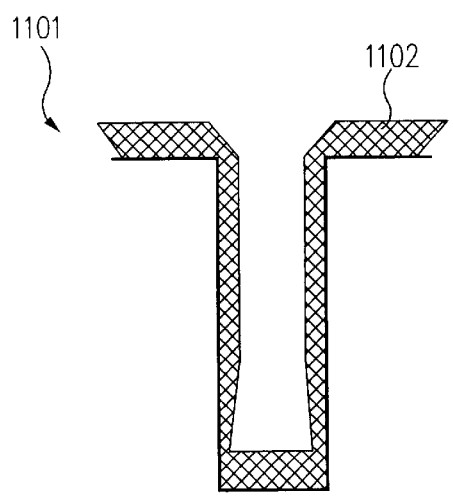
Figure 12D:
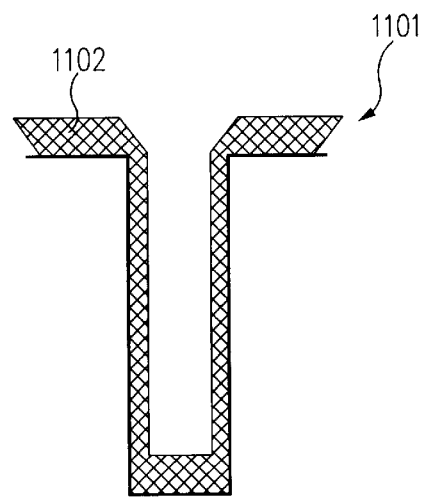

In one embodiment of the invention, the tilted magnetic fields are rotated to prevent disproportionate accumulation of metal 1102 in the top opening portion of feature 1101 and, at the same time, achieve uniform step coverage by averaging the effects of the tilting. By varying the strength of the rotating magnetic fields, the angle of the tilt relative to the substrate can be adjusted to achieve the desired step coverage for a specific application. For example, providing rotating magnetic fields below feature 1101 may result in inadequate deposition of metal 1102 on the bottom sidewall portion of feature 1101, as illustrated in FIG. 12C. In that case, the peak value of the electrical current used to energize the coils of the magnetic circuit below feature 1101 can be varied to adjust the tilt angle of the rotating magnetic fields, thereby improving the sidewall and bottom coverage of feature 1101 (see FIG. 12D).

As can be appreciated by persons skilled in the art, there are a number of ways of controlling the magnetic fields near the plane of the substrate in accordance with the present invention. For example, the magnetic fields near the plane of the substrate can be controlled by using a substrate-level magnetic circuit that generates rotating, static, step-wise, or time-averaged magnetic fields. While such a substrate-level magnetic circuit is described herein using a hollow cathode magnetron source as an example, the aspect of this disclosure dealing with the control of magnetic fields near the plane of the substrate is not so limited. The presently disclosed technique for controlling the magnetic fields near the plane of the substrate can be employed in a variety of reactors including etch reactors, chemical vapor deposition reactors, and PVD reactors utilizing a target of any shape. For example, the present substrate-level magnetic circuit can be used with the magnetron source disclosed in the commonly-owned disclosures U.S. patent application Ser. No. 09/519,429, entitled "CONTROL OF EROSION PROFILE AND PROCESS CHARACTERISTICS IN MAGNETRON SPUTTERING BY GEOMETRICAL SHAPING OF THE SPUTTERING TARGET", filed on Mar. 2, 2000, and U.S. Provisional Application No. 60/136079 filed on May 26, 1999. The just mentioned disclosures are incorporated herein by reference in their entirety.

Figure 14A:
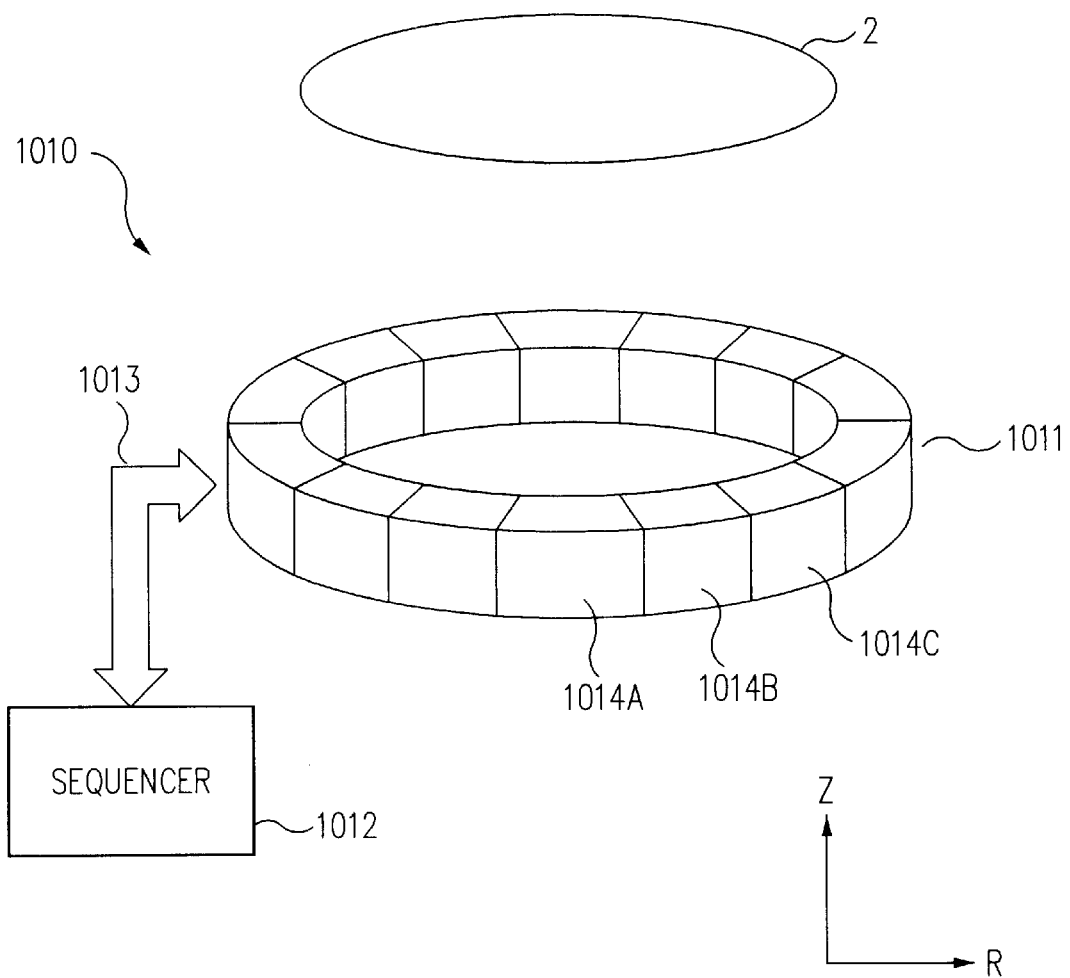
FIG. 14A shows a schematic diagram of a substrate-level magnetic circuit in one embodiment.

FIG. 14A shows a schematic diagram of a substrate-level magnetic circuit 1010 in one embodiment. Magnetic circuit 1010 includes multiple coils 1014 (i.e., coils 1014A, 1014B, 1014C.) and a sequencer 1012. Coils 1014 are arranged in a circular configuration having an inside diameter that is slightly larger than the diameter of substrate 2. The physical orientation of coils 1014 and the distance between coils 1014 and the substrate are not critical because the current through each of coils 1014 can be varied to change the magnetic field strength and thereby compensate for orientation or distance. For example, coils 1014 can be oriented to generate magnetic field lines either in the Z-direction or in the R-direction. Magnetic circuit 1010 can be parallel or at an angle relative to the plane of substrate 2.

Sequencer 1012 conventionally energizes each of coils 1014 by providing current to the coils' wires, which are schematically shown in FIG. 14A as arrow 1013. In one embodiment, each of coils 1014 is energized in rotational sequence to engulf substrate 2 in rotating magnetic fields. Coils 1014 can be energized individually or in groups of 2 or more (e.g., a pair of oppositely located coils), either clockwise or counter-clockwise.

Figure 14B:
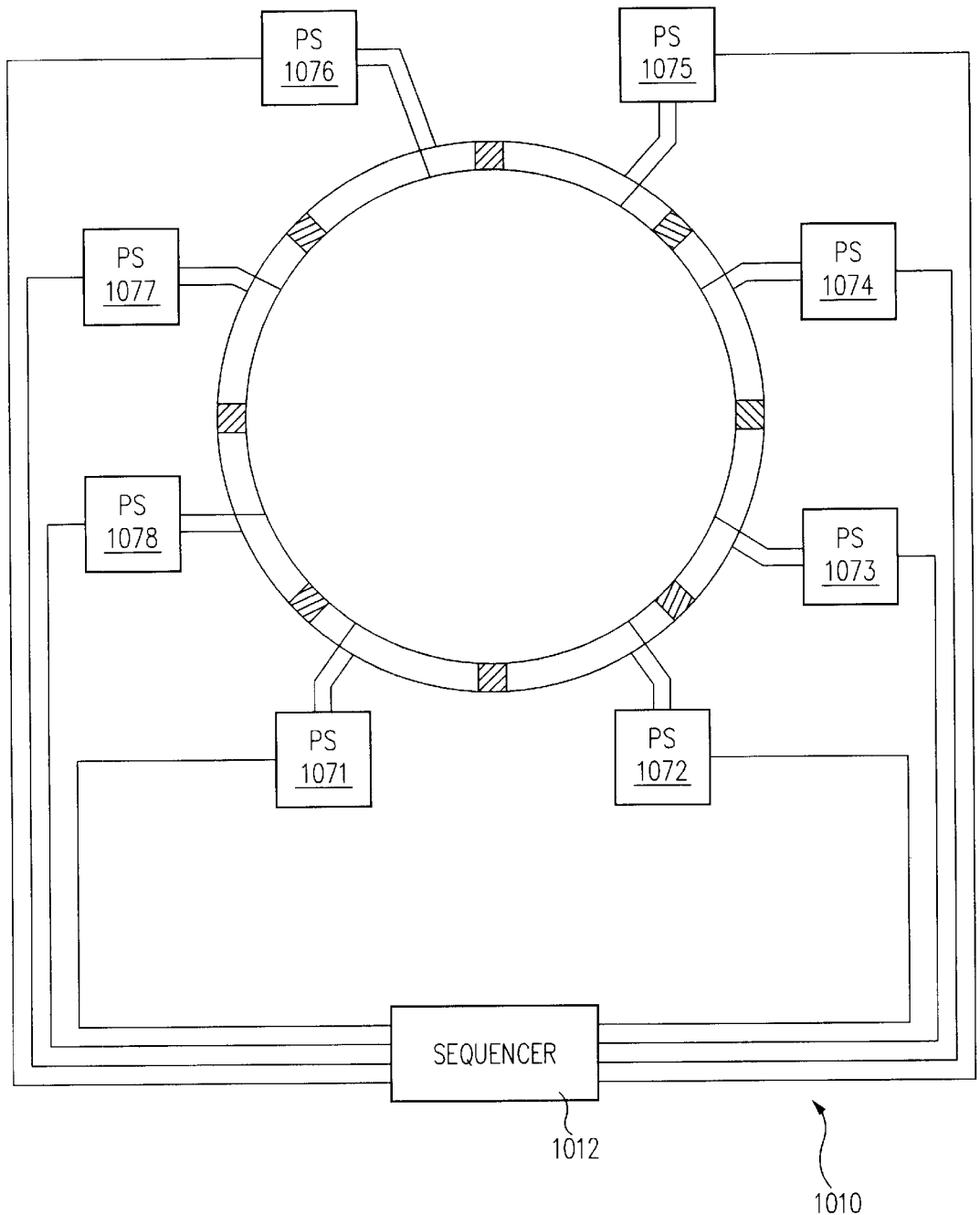
FIG. 14B shows a variation of the substrate-level magnetic circuit shown in FIG. 14A.

FIG. 14B shows an embodiment of magnetic circuit 1010 wherein 8 coils are arranged in a circular configuration, with each coil being energized by a separate power supply (PS 1071, PS 1072, . . . PS 1078) controlled by sequencer 1012. Table 1 shows a sequence for switching each power supply, thereby energizing a corresponding coil, in one embodiment.

TABLE 1

|  | Step 1 | Step 2 | Step 3 | Step 4 | Step 5 | Step 6 | Step 7 | Step 8 |
| --- | --- | --- | --- | --- | --- | --- | --- | --- |
| PS 1071 | ON | OFF | OFF | OFF | OFF | OFF | OFF | OFF |
| PS 1072 | OFF | ON | OFF | OFF | OFF | OFF | OFF | OFF |
| PS 1073 | OFF | OFF | ON | OFF | OFF | OFF | OFF | OFF |
| PS 1074 | OFF | OFF | OFF | ON | OFF | OFF | OFF | OFF |
| PS 1075 | OFF | OFF | OFF | OFF | ON | OFF | OFF | OFF |
| PS 1076 | OFF | OFF | OFF | OFF | OFF | ON | OFF | OFF |
| PS 1077 | OFF | OFF | OFF | OFF | OFF | OFF | ON | OFF |
| PS 1078 | OFF | OFF | OFF | OFF | OFF | OFF | OFF | ON |

Each step in table 1 lasts for $1/64^{th}$ of the total process time (e.g., total time to deposit material on the wafer in a PVD process). In step 1, PS 1071 is switched ON for $1/64^{th}$ of the total process time while all the other power supplies are switched OFF. In step 2, PS 1072 is switched ON for $1/64^{th}$ of the total process time while all the other power supplies are switched OFF, and so on. After step 8, step 1 is performed again and the sequence is repeated. Table 2 shows another sequence for activating the coils of the magnetic circuit 1010 shown in FIG. 14B.

TABLE 2

|  | Step 1 | Step 2 | Step 3 | Step 4 |
| --- | --- | --- | --- | --- |
| PS 1071 | ON | OFF | OFF | OFF |
| PS 1072 | OFF | ON | OFF | OFF |
| PS 1073 | OFF | OFF | ON | OFF |
| PS 1074 | OFF | OFF | OFF | ON |
| PS 1075 | ON | OFF | OFF | OFF |
| PS 1076 | OFF | ON | OFF | OFF |
| PS 1077 | OFF | OFF | ON | OFF |
| PS 1078 | OFF | OFF | OFF | ON |

Each step in table 2 lasts for $1/32^{nd}$ of the total process time. In table 2, PS 1071 and PS 1075 are switched ON at the same time for $1/32^{nd}$ of the total process time while all the other power supplies are switched OFF. PS 1072 and PS 1076 are switched ON at the same time for $1/32^{nd}$ of the total process time while all the other power supplies are switched OFF, and so on. After step 4, step 1 is performed again and the sequence is repeated.

Figure 15A:
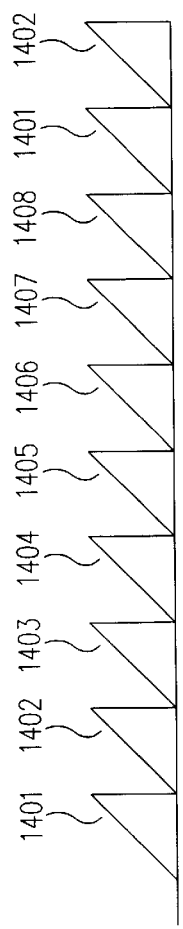
FIGS. 15A–15C show timing diagrams for energizing the coils of the substrate-level magnetic circuit shown in FIG. 14B.
Figure 15B:
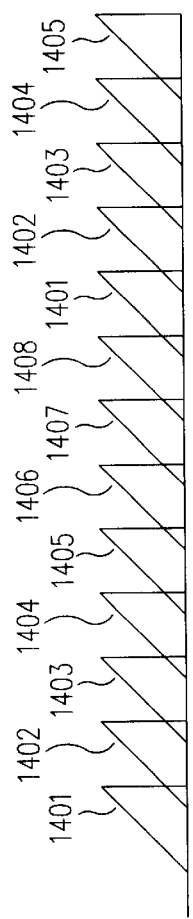
Figure 15C:
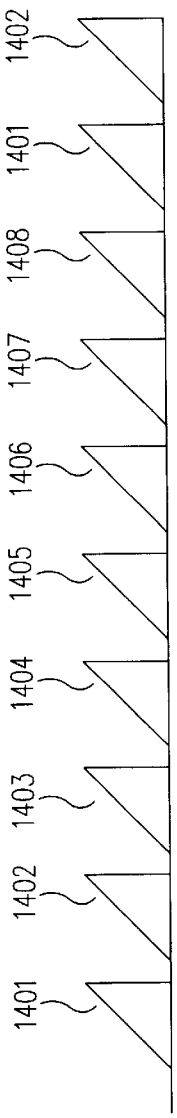

FIGS. 15A–15C show example timing diagrams for the sequence of Table 1. In FIGS. 15A–15C, signals 1401–1408 correspond to the electrical current generated by PS 1071 to PS 1078, respectively, to energize their corresponding coils. As shown, signals 1401–1408 can be generated one after another (FIG. 15A), overlapping each other (FIG. 15B), or with a pause in-between (FIG. 15C). Further, signals 1401–1408 can have a variety of waveforms including ramping up, ramping down, pulsed, and sinusoidal.

Figure 16:
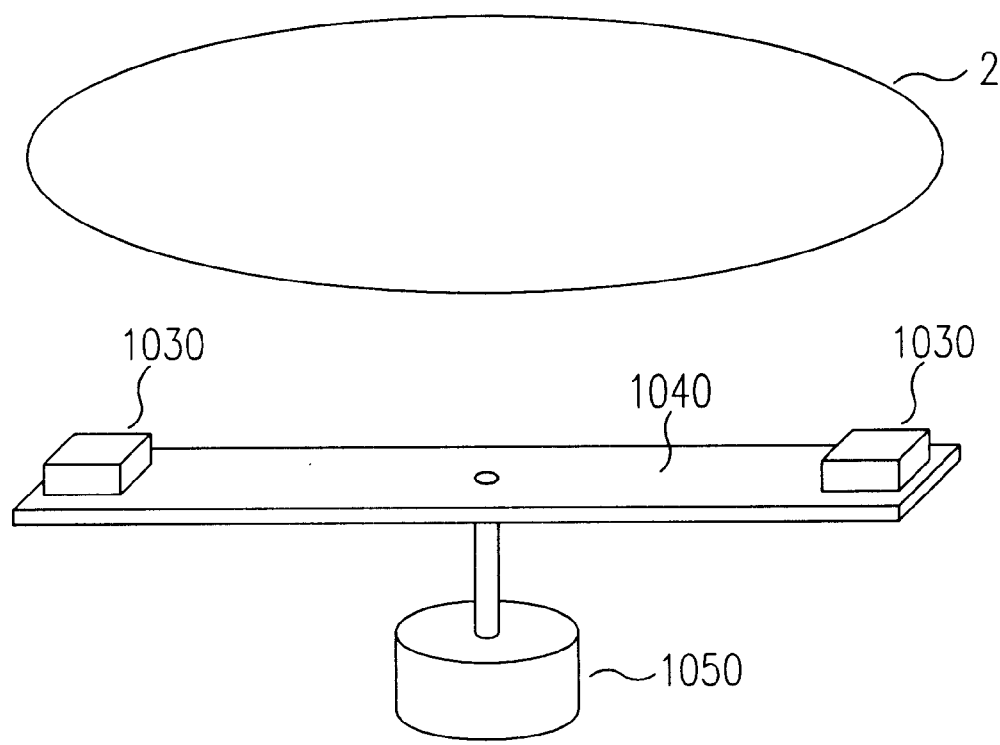
FIG. 16 shows a schematic diagram of a substrate-level magnetic circuit employing a rotating magnetic array.

In one embodiment, a substrate-level magnetic circuit in accordance with the invention is implemented using a rotating magnetic array as shown in FIG. 16. In FIG. 16, rotating magnetic fields are generated by using a motor 1050 to rotate a pole piece 1040, which supports permanent magnets 1030. As in magnetic circuit 1010 shown in FIG. 14A, the orientation of permanent magnets 1030 and the distance between magnets 1030 and the substrate are not critical. Pole piece 1040 can be parallel to the plane of substrate 2 as shown in FIG. 16, or at an angle relative to the plane of substrate 2.

Figures 17A, 17B:
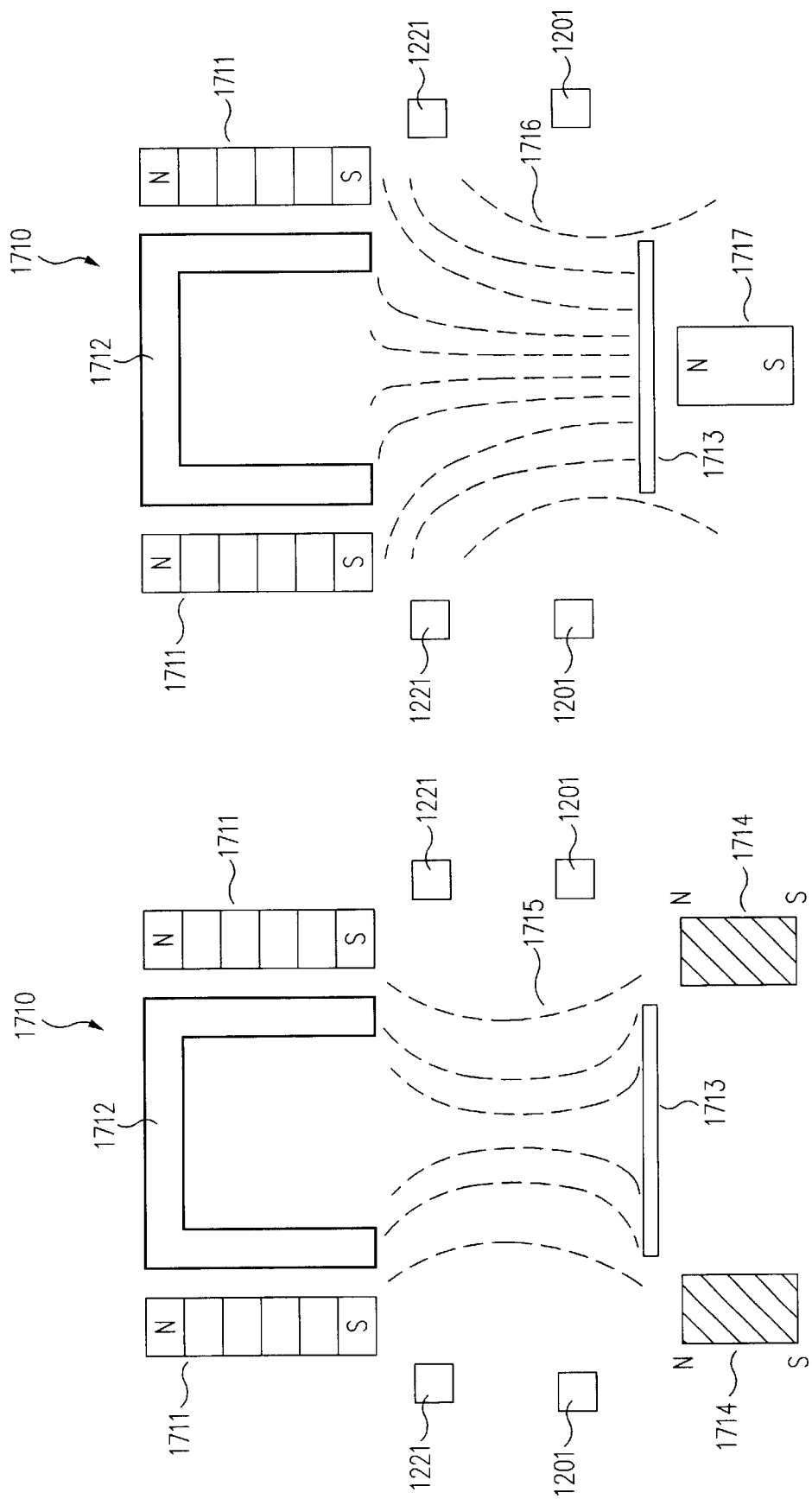
FIGS. 17A–17C show schematic diagrams of substrate-level magnetic circuits in other embodiments.
Figure 17C:
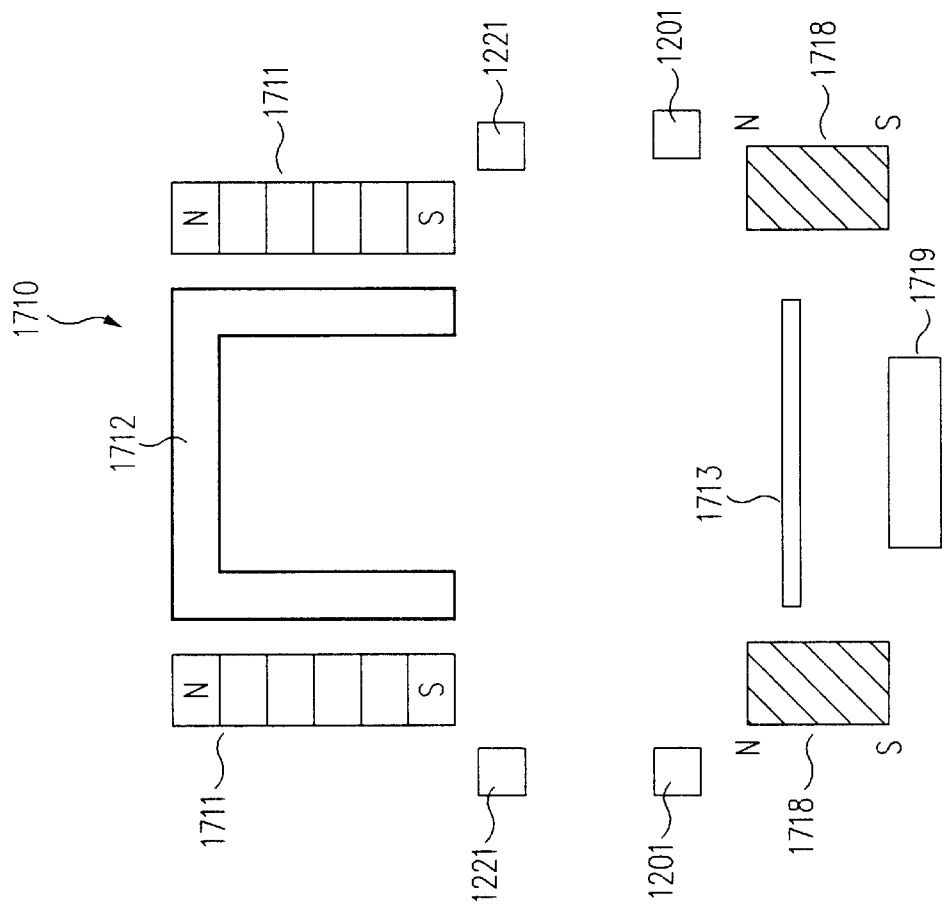

FIGS. 17A–17C show schematic diagrams of magnetic configurations for controlling the magnetic fields near the plane of a substrate in other embodiments. In FIGS. 17A–17C, a hollow cathode magnetron source 1710 (HCM 1710) is used only as a specific example. HCM 1710 includes a hollow target 1712 and a main magnetic stack 1711. Magnetic coils 1221 and 1201 (also shown in FIGS. 10A and 10B) are located between HCM 1710 and substrate 1713 to obtain high ionization efficiency and good process uniformity as previously discussed.

Referring to FIG. 17A, a circular magnet 1714 causes the portions of magnetic field lines 1715 near the plane of a substrate 1713 to diverge. Magnet 1714 can be permanent magnets arranged in a circular configuration or a single circular magnetic coil that is always energized. The diverging magnetic field lines 1715 improve step coverage uniformity by tilting the magnetic field lines all around the wafer, thereby preventing accumulation of deposited material near the top opening portion of device features in substrate 1713. Similarly, a magnet 1717 shown in FIG. 17B causes the portions of magnetic field lines 1716 near the plane of substrate 1713 to converge, thereby improving step coverage uniformity. Magnet 1717 can be a permanent magnet or a single magnetic coil that is always energized.

In FIG. 17C, the magnetic field lines near the plane of substrate 1713 are alternately diverging and converging to improve step coverage uniformity. A circular magnetic coil 1718 surrounds substrate 1713 while another circular magnetic coil 1719 is located under substrate 1713. When magnetic coil 1718 is energized while magnetic coil 1719 is OFF, magnetic field lines (not shown in FIG. 17C) near the plane of substrate 1713 diverge. On the other hand, when magnetic coil 1719 is energized while magnetic coil 1718 is OFF, magnetic field lines near the plane of substrate 1713 converge. Step coverage uniformity is improved by alternately energizing magnetic coil 1718 and magnetic coil 1719 to cause the magnetic field lines near the plane of substrate 1713 to alternately diverge and converge.

It is to be understood that the description of the invention given above is for purposes of illustration and is not intended to be limiting. Numerous variations are possible without deviating from the scope and spirit of the invention. For example, permanent magnets having pre-determined desired magnetic field strength can be used in place of electromagnets and coils. Further, the number, type, and shape of components or magnetic materials shown can be changed to achieve the same effect as that disclosed herein.

What is claimed is:

1. A magnetron sputtering system comprising:
    a magnetron source having a target;
    a semiconductor substrate in front of said target;
    a plurality of coils arranged in a circle, wherein each of said coils is oriented so as to generate a magnetic field in a direction perpendicular to a plane of said substrate; and
    a sequencer connected to said plurality of coils, said sequencer being for electrically energizing preselected ones of said coils in a preselected sequence, said plurality of coils being positioned such that said substrate is engulfed in a time-varying magnetic field as said preselected ones of said coils are energized in said preselected sequence.

2. The system of claim 1 wherein said plurality of coils are located underneath said substrate.

3. The system of claim 1 wherein said sequencer is adapted to energize said coils such that said substrate is engulfed in a rotating magnetic field.

4. The system of claim 1 wherein said circle has a diameter that is larger than a diameter of said substrate.

5. The system of claim 1 wherein each of said coils is oriented so as to generate a magnetic field in a direction parallel to a plane of said substrate.

6. The system of claim 1 wherein said sequencer is adapted so as to energize at least two of said coils at the same time.

7. The system of claim 1 wherein said target is planar.

8. The system of claim 1 wherein said target is non-planar.

9. The system of claim 8 further comprising a second magnetic circuit located between said substrate and said target.

10. The system of claim 9 further comprising a third magnetic circuit located between said plurality of coils and said second magnetic circuit.

11. A method of magnetron sputtering a film on a substrate comprising the acts of:
    providing a magnetron source, said magnetron source comprising said substrate and a target;
    generating magnetic field lines within said magnetron source, said magnetic field lines having significant directional components oriented perpendicular to a plane of said substrate;
    sputtering material from said target; and
    varying the components of said magnetic field lines that are oriented perpendicular to the plane of a substrate to influence the trajectory of ionized particles sputtered from said target arriving on said substrate.

12. The method of claim 11 wherein the act of varying causes the components of said magnetic field lines that are oriented perpendicular to the plane of said substrate to converge.

13. The method of claim 11 wherein the act of varying causes the components of said magnetic field lines that are oriented perpendicular to the plane of said substrate to diverge.

14. The method of claim 11 wherein the act of varying causes the components of said magnetic field lines that are oriented perpendicular to the plane of said substrate to alternately converge and diverge.

15. The method of claim 11 wherein the act of varying is performed by rotating magnetic field lines from underneath said substrate.

* * * * *